(12) United States Patent
Hwang et al.

(10) Patent No.: US 11,436,152 B2
(45) Date of Patent: Sep. 6, 2022

(54) DATA TRANSMISSION CIRCUIT FOR PREVENTING A NODE FROM FLOATING AND METHOD OF OPERATING THE SAME

(71) Applicant: SK hynix Inc., Gyeonggi-do (KR)

(72) Inventors: Jin Ha Hwang, Gyeonggi-do (KR); Kyeong Min Chae, Gyeonggi-do (KR); Jun Sun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 56 days.

(21) Appl. No.: 16/994,180

(22) Filed: Aug. 14, 2020

(65) Prior Publication Data

US 2021/0271605 A1     Sep. 2, 2021

(30) Foreign Application Priority Data

Mar. 2, 2020   (KR) .................... 10-2020-0026213

(51) Int. Cl.
*G06F 12/0891*     (2016.01)
*G11C 7/10*         (2006.01)
*G06F 1/3203*      (2019.01)

(52) U.S. Cl.
CPC ........ *G06F 12/0891* (2013.01); *G06F 1/3203* (2013.01); *G11C 7/10* (2013.01)

(58) Field of Classification Search
CPC .................. G06F 1/3203; G06F 11/10; G06F 2212/1032; G06F 2212/7201; G06F 2212/7203; G06F 2212/7208; G11C 7/10; G11C 7/1066; G11C 7/1057; G11C 7/106; G11C 5/148
See application file for complete search history.

(56) References Cited

U.S. PATENT DOCUMENTS

| | | | |
|---|---|---|---|
| 10,706,940 B2 * | 7/2020 | Handa | G11C 16/08 |
| 2004/0047211 A1 * | 3/2004 | Jeung | G11C 7/1051 365/202 |
| 2004/0105292 A1 * | 6/2004 | Matsui | G11C 11/4093 365/63 |
| 2013/0145193 A1 * | 6/2013 | Takahashi | H03K 17/22 713/323 |
| 2014/0084972 A1 * | 3/2014 | Nakamura | H03K 17/223 327/143 |
| 2016/0148657 A1 * | 5/2016 | Lin | G11C 7/106 365/72 |
| 2017/0317672 A1 * | 11/2017 | Gupta | H03K 17/223 |
| 2020/0294605 A1 * | 9/2020 | Handa | G11C 16/32 |

FOREIGN PATENT DOCUMENTS

| | | |
|---|---|---|
| KR | 10-2006-0130931 | 12/2006 |
| KR | 10-2010-0100132 | 9/2010 |

* cited by examiner

*Primary Examiner* — Raymond N Phan
(74) *Attorney, Agent, or Firm* — IP & T Group LLP

(57) ABSTRACT

The present technology relates to an electronic device. A data transmission circuit that receives data from an outside and transmits the received data, wherein the data transmission circuit includes a storage configured of a plurality of stages that stores the data, and a reset control circuit configured to generate a signal based on the data.

17 Claims, 14 Drawing Sheets

FIG. 8A

| CLK = HIGH,<br>CLKB = LOW,<br>PORB = HIGH | IN = LOW, INB = HIGH |
|---|---|
| TR1 | ON |
| TR2 | OFF |
| TR3 | ON |
| TR4 | OFF |
| TR5 | OFF |
| TR6 | OFF |
| TR7 | OFF |

FIG. 8B

| CLK = HIGH,<br>CLKB = LOW,<br>PORB = HIGH | IN = HIGH, INB = LOW |
|---|---|
| TR1 | ON |
| TR2 | ON |
| TR3 | OFF |
| TR4 | OFF |
| TR5 | OFF |
| TR6 | OFF |
| TR7 | OFF |

2nd STAGE

| CLK = HIGH,<br>CLKB = LOW | POUT = Floating |
|---|---|
| TR11 | ON |
| TR12 | ON |
| TR13 | OFF |
| TR14 | OFF |
| TR15 | ON |
| TR16 | OFF |
| TR17 | OFF |

DATA TRANSMISSION CIRCUIT FOR PREVENTING A NODE FROM FLOATING AND METHOD OF OPERATING THE SAME

CROSS-REFERENCE TO RELATED APPLICATION

The present application claims priority under 35 U.S.C. § 119(a) to Korean patent application number 10-2020-0026213, filed on Mar. 2, 2020, which is incorporated herein by reference in its entirety.

BACKGROUND

1. Field of Invention

The present disclosure relates to an electronic device, and more particularly, to a data transmission circuit and a method of operating the same.

2. Description of Related Art

A storage device is a device that stores data under control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a non-volatile memory.

The storage device may include a memory device in which data is stored and a memory controller that stores data in the memory device. The memory device may be classified into a volatile memory and a non-volatile memory. Here, the non-volatile memory includes a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM) and the like.

SUMMARY

An embodiment of the present disclosure provides a data transmission circuit and a method of operating the same, capable of preventing a node from floating by generating a signal according to input data.

A data transmission circuit according to an embodiment of the present disclosure receives data from an outside and transmits the received data. The data transmission circuit may include a storage configured of a plurality of stages that stores the data, and a reset control circuit configured to generate a signal based on the data.

A method of operating a data transmission circuit according to an embodiment of the present disclosure is a method including a reset control circuit and a storage configured of a plurality of stages. The method may include receiving data from an outside, generating a control signal based on the data, and resetting the storage based on the control signal.

A data storage circuit according to an embodiment of the present disclosure may include an enable controller configured to control enabling the data storage circuit according to a strobe signal, a current mirror component configured to provide the same current to different nodes according to the strobe signal, a data input circuit configured to receive data provided from an outside, a data output circuit configured to output data in response to the received data based on a current changed by the current mirror component, a power reset signal generator configured to generate a power reset signal, and a reset controller configured to reset the data output circuit in response to the received data and the power reset signal.

When an initialization signal of a low state is input to the reset controller, the reset controller may reset the data output circuit according to the power reset signal regardless of the received data.

When an initialization signal of a high state is input to the reset controller, the reset controller may reset the data output circuit according to the received data and the power reset signal.

When the received data is a logic low, the reset controller may reset the data output circuit regardless of the power reset signal.

When the received data is a logic high, the reset controller may reset the data output circuit according to the power reset signal.

A data storage circuit according to an embodiment of the present disclosure may include a data storage configured to store and output data received from an outside in response to a strobe signal, a data reset component configured to reset the data output from the data storage to a predetermined level, a power reset signal generator configured to generate a power reset signal, and a reset controller configured to reset an output of the data output from the data storage in response to the data received by the data storage and the power reset signal.

When an initialization signal of a low state is input to the reset controller, the reset controller may control the data reset component to reset the data output from the data storage according to the power reset signal regardless of the data received by the data storage.

When an initialization signal of a high state is input to the reset controller, the reset controller may control the data reset component to reset the data output from the data storage according to the data received by the data storage and the power reset signal.

When the data is a logic low, the reset controller may control the data reset component to reset the data output from the data storage regardless of the power reset signal.

When the data is a logic high, the reset controller may control the data reset component to reset the data output from the data storage according to the power reset signal.

A semiconductor apparatus according to an embodiment of the present disclosure may include a first circuit suitable for generating, in an idle state of the semiconductor apparatus, first and second reset signals respectively having the same level as first and second input signals, a second circuit suitable for storing the first and second input signals and outputting stored signals respectively through output nodes, a third circuit suitable for resetting voltage levels of the output nodes respectively in response to the first and second reset signals, a fourth circuit suitable for latching the output signals, and a fifth circuit suitable for outputting the latched signals.

According to the present technology, a signal is generated according to input data and the generated signal is applied to the gate of the transistor included in the data transmission circuit so as not to float a node where a leakage current may occur. Therefore, reliability of the data transmission circuit may be improved.

BRIEF DESCRIPTION OF THE DRAWINGS

FIGS. 8A and 8B are diagrams for describing turning-on or turning-off of transistors included in FIG. 7.

DETAILED DESCRIPTION

Specific structural or functional descriptions of embodiments which are disclosed in the present specification or application are illustrated only to describe the embodiments of the present disclosure, and is not limiting. The embodiments of the present disclosure may be carried out in various forms and the descriptions are not limited to the embodiments described in the present specification or application.

Figure 1:
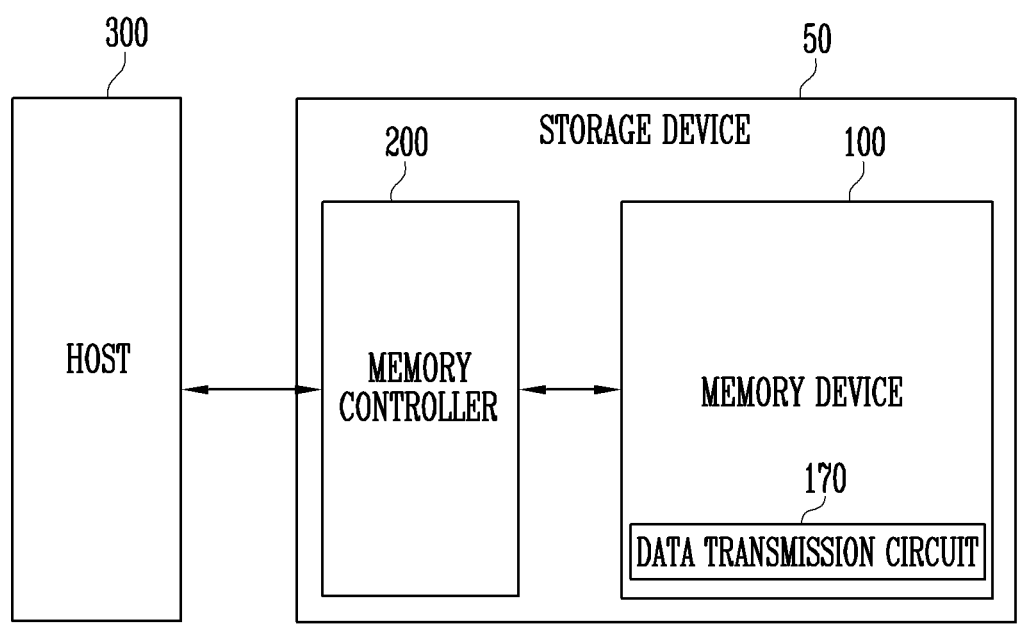
FIG. 1 is a block diagram for describing a storage device.

FIG. 1 is a block diagram for describing a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells for storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a SLC method in which one data bit is stored in one memory cell. In some embodiments, the memory device 100 may operate in a method of storing at least two data bits in one memory cell. For example, the memory device 100 may operate as a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write operation (program operation), a read operation, or an erase operation according to the received command. For example, when a program command is received, the memory device 100 may program data to the area selected by the address. When a read command is received, the memory device 100 may read data from the area selected by the address. When an erase command is received, the memory device 100 may erase data stored in the area selected by the address.

The memory device 100 may include a data transmission circuit 170. The data transmission circuit 170 may include a latch circuit that temporarily stores data and a reset control circuit that generates a signal applied to the latch circuit according to data input from the outside. Here, since the latch circuit temporarily stores the data, the latch circuit may be a storage such as a buffer circuit.

In an embodiment, the data transmission circuit 170 included in the memory device 100 is described, however, the data transmission circuit 170 may be used in various devices capable of transmitting data or a signal in addition to the memory device 100.

In addition, the data transmission circuit 170 may be configured of a plurality of transistors and a plurality of gates connected to input/output pins. The data transmission circuit 170 may receive a signal and data through the input/output pins, and output the received data to an input/output circuit.

In an embodiment, the data transmission circuit 170 may transmit data in response to a clock. The data transmission circuit 170 may temporarily store the received data and then output the stored data.

The data transmission circuit 170 may include a reset control circuit (not shown) for preventing a node from floating. The reset control circuit may generate signals of different states according to input data. The signal generated by the reset control circuit may be applied to gates of at least two of transistors included in the data transmission circuit 170.

The memory controller 200 may control overall operations of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide a command, an address, and data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
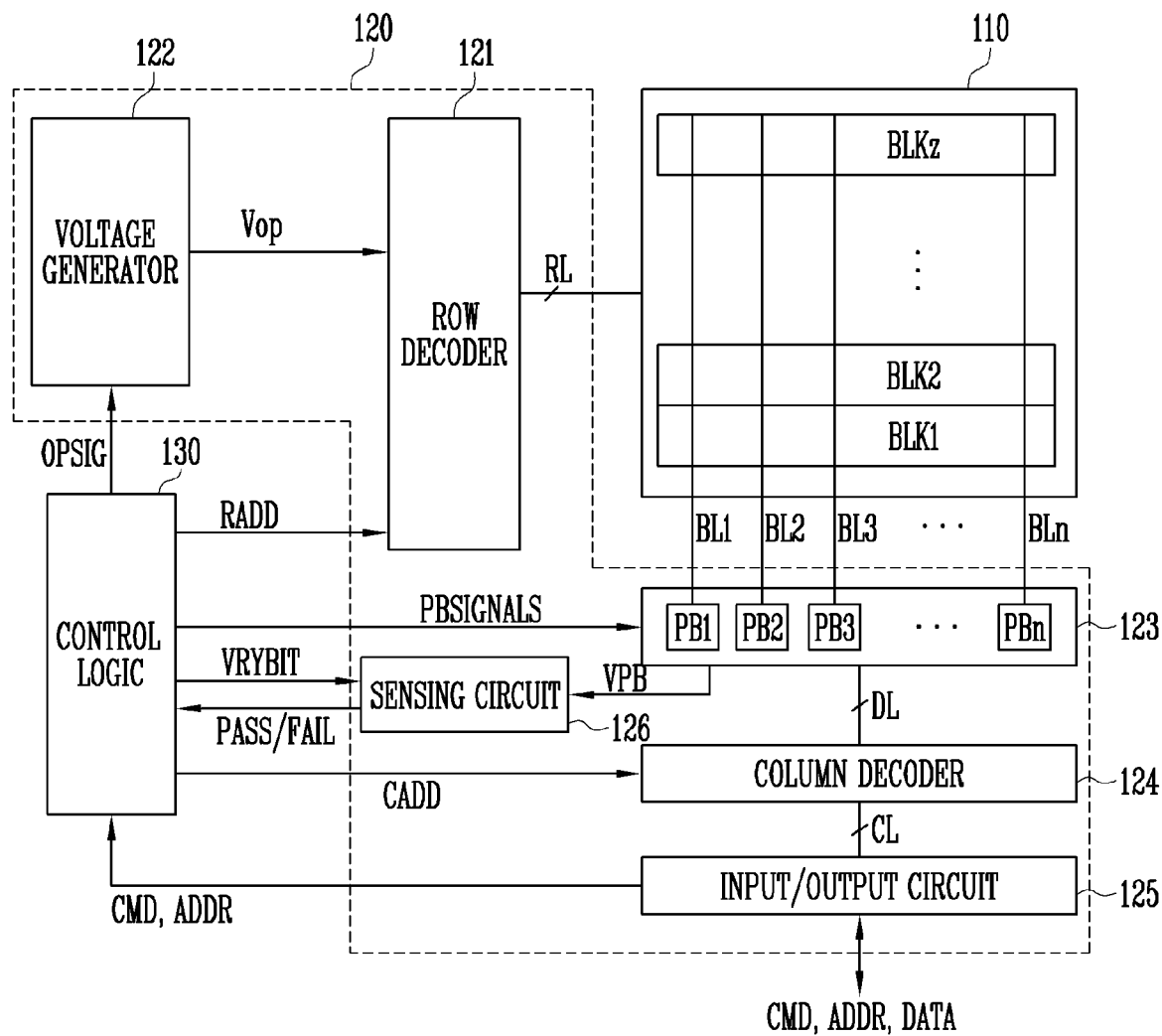
FIG. 2 is diagram for describing a structure of a memory device of FIG. 1.

FIG. 2 is diagram for describing a structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, the TLC that stores three data bits, or a quadruple level cell (QLC) that stores four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn, or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and output the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verify operation has passed or failed in response to the pass or fail signal PASS or FAIL.

The memory cells included in the memory cell array 110 may be programmed to any one of a plurality of program states according to data stored in each memory cell. A target program state of the memory cell may be determined as any one of the plurality of program states according to data to be stored.

Figure 3:
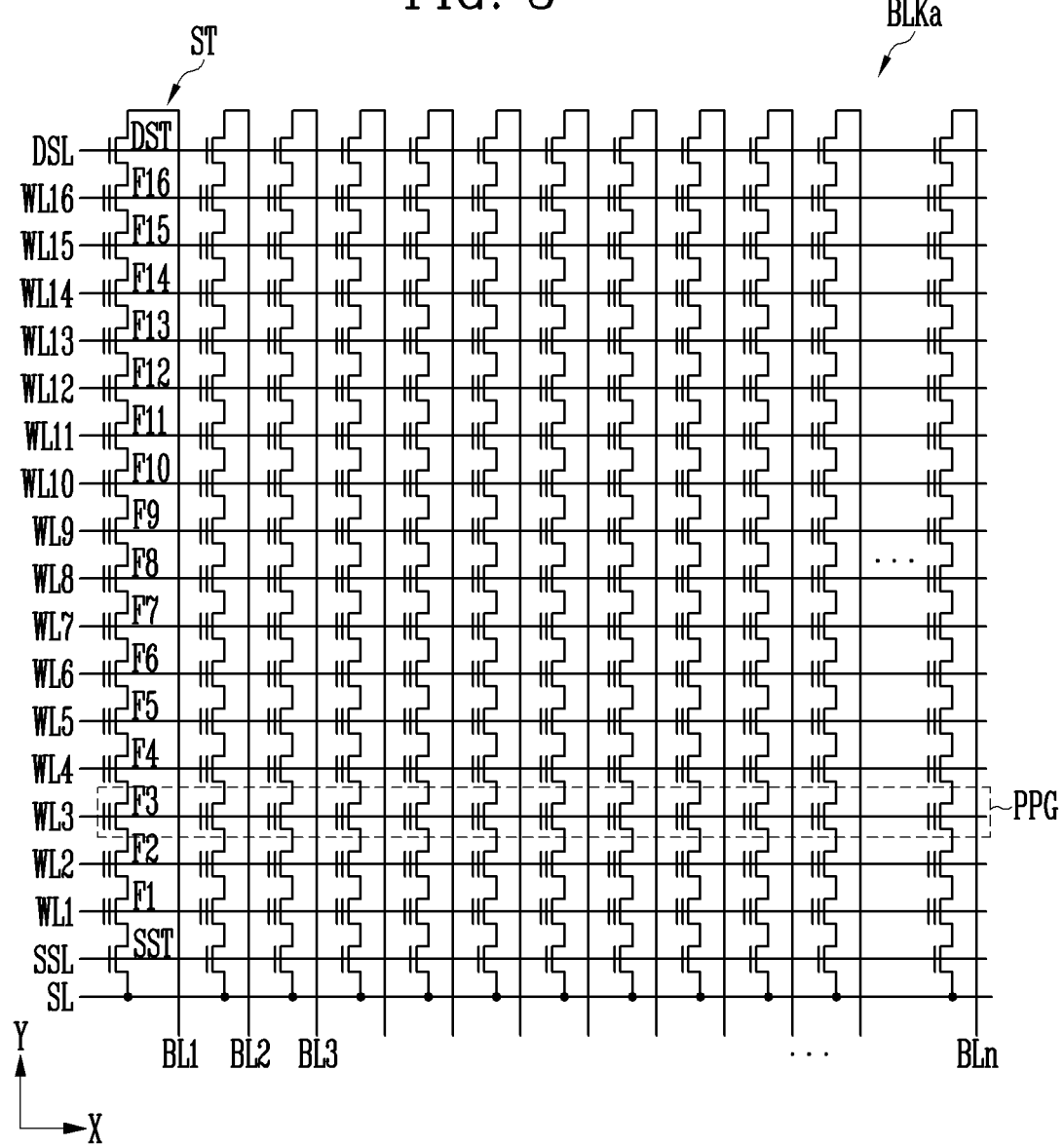
FIG. 3 is a diagram for describing a memory block.

FIG. 3 is a diagram for describing a memory block.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Since the strings may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 or more than the number of memory cells shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell increases, the multi-level cell (MLC) refers to a memory cell in which two bits of data is stored, a memory cell in which three or more bits of data are stored is referred to as a triple level cell (TLC), and a memory cell in which four or more bits of data are stored is referred to as a quadruple level cell (QLC). In addition, a memory cell method in which a plurality of bits of data are stored has been developed, and an embodiment may be applied to the memory device in which two or more bits of data are stored.

In another embodiment, the memory block may have a three-dimensional structure. Each memory block includes a plurality of memory cells stacked on a substrate. Such a plurality of memory cells are arranged along a +X direction, a +Y direction, and a +Z direction.

Figure 4:
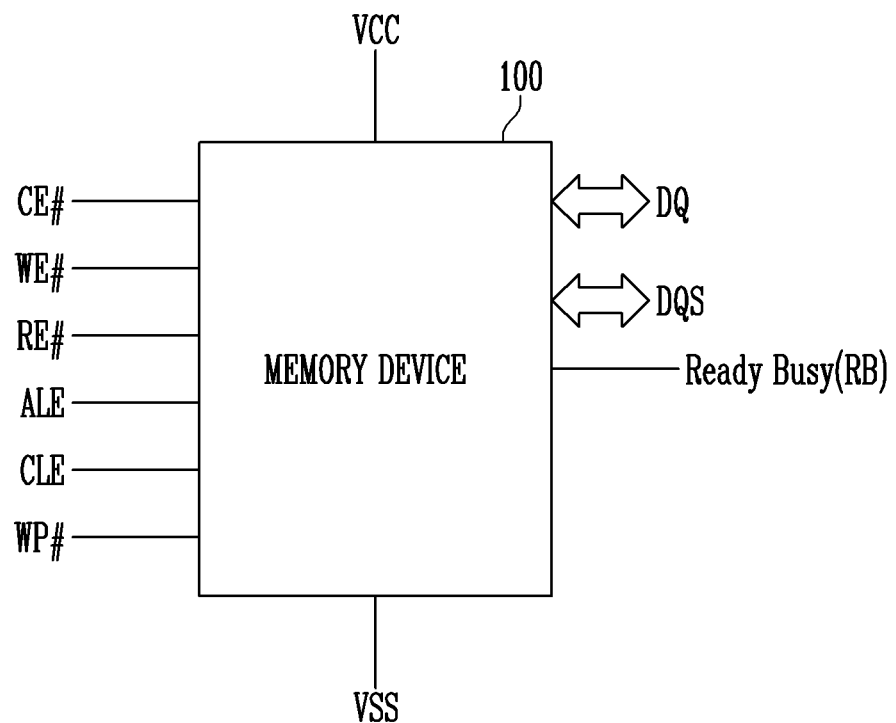
FIG. 4 is a diagram for describing a pin configuration of the memory device of FIG. 1.

FIG. 4 is a diagram for describing a pin configuration of the memory device of FIG. 1.

Referring to FIG. 4, the memory device 100 may communicate with an external controller through a plurality of input/output lines. For example, the memory device 100 communicates with the external controller through data input/output lines DQ and control signal lines including a chip enable line CE#, a write enable line WE#, a read enable line RE#, an address latch enable line ALE, a command latch enable line CLE, a write protection line WP#, and a ready busy line RB.

In an embodiment, the memory device 100 may receive strobe signals from the outside through input/output strobe lines DQS. The strobe signal may be a signal indicating that data is received from an external controller. For example, a clock input from the outside may be the strobe signal. Specifically, the strobe signal may indicate that the data is received into the memory device 100 through the input/output lines DQ by the clock signal that changes from a low state to a high state.

The memory device 100 may receive a chip enable signal from the external controller through the chip enable line CE#. The memory device 100 may receive a write enable signal from the external controller through the write enable line WE#. The memory device 100 may receive a read enable signal from the external controller through the read enable line RE#. The memory device 100 may receive an address latch enable signal from the external controller through the address latch enable line ALE. The memory device 100 may receive a command latch enable signal from the external controller through the command latch enable line CLE. The memory device 100 may receive a write protection signal from the external controller through the write protection line WP#.

In an embodiment, the memory device 100 may provide a read busy signal outputting whether the memory device 100 in a ready state or a busy state to the memory controller through the ready busy line RB.

The chip enable signal may be a control signal for selecting the memory device 100. When the chip enable signal is in a 'high' state and the memory device 100 corresponds to the 'ready' state, the memory device 100 may enter a low power standby state.

The write enable signal may be a control signal for controlling storage of the command, the address, and input data, which are input to the memory device 100, in a latch.

The read enable signal may be a control signal for enabling an output of serial data.

The address latch enable signal may be one of control signals used by the host to indicate whether a type of a signal input to the input/output lines DQ is the command, the address, or the data.

The command latch enable signal may be one of control signals used by the host to indicate whether the type of the signal input to the input/output lines DQ is the command, the address, or the data.

For example, when the command latch enable signal is activated (for example, logic high), the address latch enable signal is deactivated (for example, logic low), and the write enable signal is activated (for example, logic low) and then deactivated (for example, logic high), the memory device 100 may identify that the signal input through the input/output lines DQ may be the command.

For example, when the command latch enable signal is deactivated (for example, logic low), the address latch enable signal is activated (for example, logic high), and the write enable signal is activated (for example, logic low) and then deactivated (for example, logic high), the memory device 100 may identify that the signal input through the input/output lines DQ may be the address.

The write protection signal may be a control signal for deactivating the memory device 100 from performing the program operation and the erase operation.

The ready busy signal may be a signal for identifying a state of the memory device 100. That is, the ready busy signal of a low state indicates that the memory device 100 is performing at least one operation. The ready busy signal of a high state indicates that the memory device 100 is not performing the operation.

The ready busy signal may be in the low state while the memory device 100 performs any one of the program operation, the read operation, and the erase operation. In an embodiment of the present disclosure, the memory controller 200 described with reference to FIG. 1 may determine an end time point, that is, a time point at which the program operation or the erase operation is ended based on the ready busy signal.

In an embodiment, the data transmission circuit 170 of FIG. 1 of the present disclosure may be connected to the input/output lines DQ and the input/output strobe lines DQS. Therefore, the data transmission circuit 170 of FIG. 1 of the present disclosure may store the data received through the input/output lines DQ and output the stored data to program the stored data in memory cells.

Figure 5:
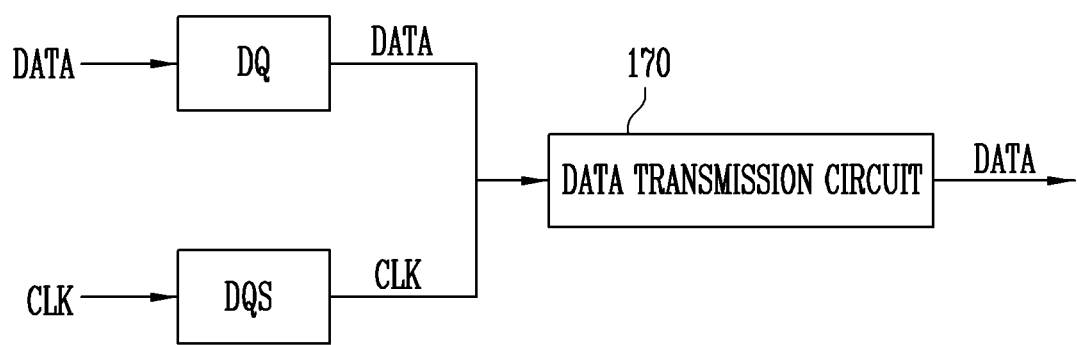
FIG. 5 is a diagram for describing a data transmission circuit connected to input/output lines and input/output strobe lines of FIG. 4.

FIG. 5 is a diagram for describing the data transmission circuit connected to the input/output lines and the input/output strobe lines of FIG. 4.

Referring to FIG. 5, FIG. 5 shows the input/output lines (DQ) and the input/output strobe lines (DQS) connected to the memory device 100 of FIG. 4 and the data transmission circuit 170 included in the memory device 100 of FIG. 4.

In an embodiment, data DATA may be received from the outside through the input/output lines (DQ). The data DATA received through the input/output lines (DQ) may be data to be programmed in the memory cells included in the memory device 100 of FIG. 4. The data DATA received through the input/output lines (DQ) may be transferred to the data transmission circuit 170.

In an embodiment, a clock CLK may be received through the input/output strobe lines (DQS). When the memory device 100 of FIG. 4 does not operate, the clock CLK received from the outside may be in a low state, and when the memory device 100 of FIG. 4 operates, the clock CLK received from the outside may be changed from the low state to a high state.

When the clock CLK received through the input/output strobe lines (DQS) maintains the high state, the memory device 100 of FIG. 4 may be in an idle state. That is, when the clock CLK is changed from the high state to the low state or changed from the low state to the high state, the memory device 100 of FIG. 4 may operate.

When the clock CLK is changed from the low state to the high state, the data transmission circuit 170 may receive the data DATA through the input/output lines (DQ). The received data DATA may be temporarily stored in the data transmission circuit 170. The data DATA stored in the data transmission circuit 170 may be output to the input/output circuit 125 of FIG. 2 and may be programmed in the memory cells included in the memory cell array 110 of FIG. 2.

Figure 6:
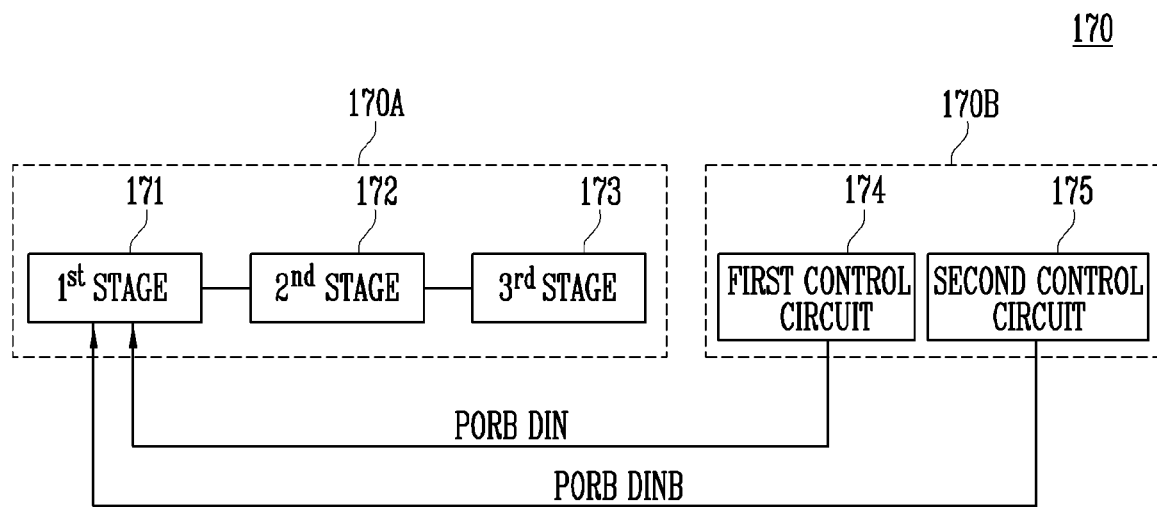
FIG. 6 is a diagram for describing a structure of the data transmission circuit of FIG. 5.

FIG. 6 is a diagram for describing a structure of the data transmission circuit of FIG. 5.

Referring to FIG. 6, FIG. 6 shows a latch circuit 170A and a reset control circuit 170B included in the data transmission circuit 170. The latch circuit 170A included in the data transmission circuit 170 of FIG. 6 may include first to third stages $1^{st}$ to $3^{rd}$ STAGEs, and the first to third stages $1^{st}$ to $3^{rd}$ STAGEs may be configured of a plurality of transistors and a plurality of inverters. In addition, the reset control circuit 170B included in the data transmission circuit 170 of FIG. 6 may include first and second control circuits 174 and 175, and the first and second control circuits 174 and 175 may be configured of a plurality of inverters and a plurality of NOR gates.

In an embodiment, the latch circuit 170A may temporarily store the data to be programmed in the memory cells included in the memory cell array 110 of FIG. 2. Here, since the latch circuit 170A serves to temporarily store data, the latch circuit 170A may be a storage such as a buffer circuit. In order to store the data in the latch circuit 170A, a signal of a high state or a signal of a low state may be applied to the plurality of transistors and the plurality of inverters included in the latch circuit 170A.

However, in a process of storing the data in the latch circuit 170A, a node may float in at least one of the first to third stages $1^{st}$ to $3^{rd}$ STAGEs. For example, transistors connected to a node included in any one of the first to third stages $1^{st}$ STAGE to $3^{rd}$ STAGE may be simultaneously turned off, and thus a corresponding node may float.

In order to prevent the node from floating, the data transmission circuit 170 of the present disclosure may include the reset control circuit 170B. A first control circuit 174 and a second control circuit 175 included in the reset control circuit 170B may generate first and second signals PORB DIN and PORB DINB, respectively, to be applied to transistors included in the first stage $1^{st}$ STAGE. The first stage $1^{st}$ STAGE may be a buffer that stores and outputs data. The reset control circuit 170B may generate the first and second signals PORB DIN and PORB DINB having different states from each other, for example, a high state or a low state, according to input data input to the first stage 1$^{st}$ STAGE.

In an embodiment, the reset control circuit 170B may generate the first and second signals PORB DIN and PORB DINB of different states and provide the first signal PORB DIN and the second signal PORB DINB to the first stage 1$^{st}$ STAGE. The first stage 1$^{st}$ STAGE may receive the first signal PORB DIN and the second signal PORB DINB from the reset control circuit 170B and apply the first signal PORB DIN and the second signal PORB DINB to the gates of the plurality of transistors. When the first signal PORB DIN and the second signal PORB DINB of different states are provided to the first stage 1$^{st}$ STAGE, the node may be prevented from floating in the latch circuit 170A.

Figure 7:
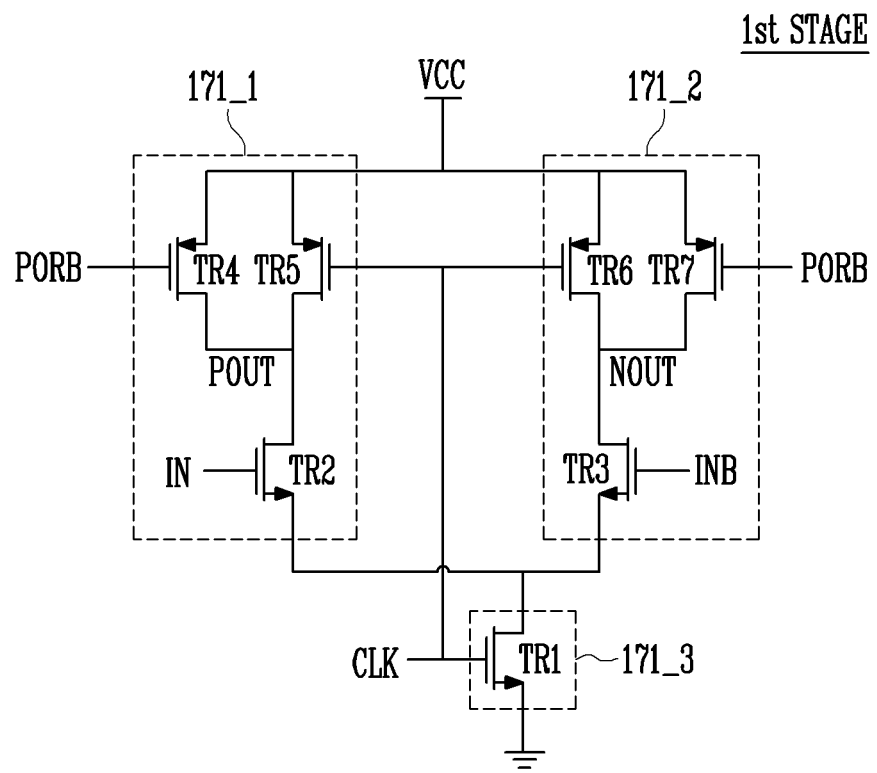
FIG. 7 is a diagram for describing a configuration of a first stage $1^{st}$ STAGE of FIG. 6.

FIG. 7 is a diagram for describing a configuration of the first stage 1$^{st}$ STAGE of FIG. 6.

Referring to FIGS. 6 and 7, FIG. 7 shows the first stage 1$^{st}$ STAGE of the first to third stages 1$^{st}$ to 3$^{rd}$ STAGEs included in the latch circuit 170A of FIG. 6. The first stage 1$^{st}$ STAGE may be a buffer that stores and outputs data. The first stage 1$^{st}$ STAGE may be configured of first and second input circuits 171_1 and 171_2 and a first driving circuit 171_3. The first and second input circuits 171_1 and 171_2 may be connected in parallel to each other between a node of a power source VCC and the first driving circuit 171_3.

In an embodiment, the first input circuit 171_1 may be configured of second, fourth, and fifth transistors TR2, TR4, and TR5, the second input circuit 171_2 may be configured of third, sixth, and seventh transistors TR3, TR6, and TR7, and the first driving circuit 171_3 may be configured of a first transistor TR1. The first to third transistors TR1 to TR3 may be implemented as NMOS transistors, and the fourth to seventh transistors TR4 to TR7 may be implemented as PMOS transistors.

In an embodiment, an inverted power on reset signal PORB, an input signal IN and the clock CLK are input to the first input circuit 171_1, and an inverted power on reset signal PORB, an inverted input signal INB, and the clock CLK may be input to the second input circuit 171_2. The clock CLK may be input to the first driving circuit 171_3. In FIG. 7, it is assumed that a state of the memory device 100 of FIG. 4 is in the idle state, and thus the clock CLK is in a high state.

Specifically, the clock CLK may be applied to a gate of the first transistor TR1 of the first driving circuit 171_3. Since the clock CLK is in the high state, the first transistor TR1 may be turned on.

In an embodiment, the input signal IN may be input to a gate of the second transistor TR2 of the first input circuit 171_1, and the inverted input signal INB may be input to a gate of the third transistor TR3 of the second input circuit 171_2. The input signal IN may be input data, and the inverted input signal INB may be inverted input data. The input signal IN and the inverted input signal INB may be signals having opposite phases, and may be in a high state (1) or a low state (0), respectively.

When the input signal IN is in a high state, the inverted input signal INB may be in a low state, and when the input signal IN is in a low state, the inverted input signal INB may be in a high state. When the input signal IN of the high state is '1' data and the input signal IN of the low state is '0' data, in a case where the input signal IN is '1', the inverted input signal INB may be '0', and in a case where the input signal IN is '0', the inverted input signal INB may be '1'.

In an embodiment, when the input signal IN is '1' and the inverted input signal INB is '0', the second transistor TR2 may be turned on, and the third transistor TR3 may be turned off. Conversely, when the input signal IN is '0' and the inverted input signal INB is '1', the second transistor TR2 may be turned off, and the third transistor TR3 may be turned on.

In FIG. 7, the input signal IN applied to the gate of the second transistor TR2 is '0'.

Since the input signal IN applied to the gate of the second transistor TR2 is '0', the second transistor TR2 may be turned off. Since the input signal IN is '0', the inverted input signal INB applied to the gate of the third transistor TR3 may be '1', and the third transistor TR3 may be turned on.

In an embodiment, the clock CLK of the high state may be applied to gates of the fifth transistor TR5 of the first input circuit 171_1 and the sixth transistor TR6 of the second input circuit 171_2. Therefore, the fifth and sixth transistors TR5 and TR6 may be turned off.

In an embodiment, the inverted power on reset signal PORB applied to gates of the fourth transistor TR4 of the first input circuit 171_1 and the seventh transistor TR7 of the second input circuit 171_2 may be in a high state. The inverted power on reset signal PORB may be in a low state and then changed from the low state to the high state when the memory device 100 of FIG. 4 is in the idle state. In FIG. 7, since the state of the memory device 100 of FIG. 4 is in the idle state, the inverted power on reset signal PORB may be in the high state. Therefore, the fourth and seventh transistors TR4 and TR7 may be turned off.

Since the seventh transistor TR7 is turned off, a node NOUT may remain as a low state. However, as the fourth transistor TR4 is turned off, a node POUT may float whenever the clock CLK is high. When the node POUT floats, a current should not flow through the node POUT. However, when a leakage current occurs in some of the second, fourth, and fifth transistors TR2, 4, and 5, reliability of the first stage 1$^{st}$ STAGE may be reduced.

Therefore, in order to prevent a node from floating, in the present disclosure, a method of setting the inverted power on reset signal PORB according to a pattern of the input signal IN is proposed.

FIGS. 8A and 8B are diagrams for describing the turning-on or turning-off of the transistors included in FIG. 7.

Referring to FIGS. 7, 8A and 8B, FIG. 8A shows the turning-on ON or turning-off OFF of the first to seventh transistors TR1 to TR7 when the input signal is in a low state (IN=LOW) and the inverted input signal is in a high state (INB=HIGH), and FIG. 8B shows the turning-on ON or turning-off OFF of the first to seventh transistors TR1 to TR7 when the input signal is in a high state (IN=HIGH) and the inverted input signal is in a low state (INB=LOW).

In FIGS. 8A and 8B, example case shows that the clock input from the outside is in a high state (CLK=HIGH), a clock inversion signal is in a low state (CLKB=LOW), and the inverted power on reset signal PORB is in a high state (PORB=HIGH). That is, FIGS. 8A and 8B show the turning-on ON or the turning-off OFF of the first to seventh transistors TR1 to TR7 when the memory device 100 of FIG. 1 is in the idle state.

Referring to FIGS. 7, 8A and 8B, in FIGS. 8A and 8B, since the clock CLK is in the high state (CLK=HIGH), the first transistor TR1 may be turned on. In addition, the fifth and sixth transistors TR5 and TR6 may be turned off.

In FIG. 8A, since the input signal IN is in the low state, the second transistor TR2 may be turned off, and since the inverted input signal INB is in the high state, the third transistor TR3 may be turned on. Since the inverted power on reset signal PORB is in the high state, the fourth and seventh transistors TR4 and TR7 may be turned off.

Therefore, as the seventh transistor TR7 is turned off and the first and third transistors TR1 and TR3 are turned on, the node NOUT may be in a low state. However, as the second and fourth transistors TR2 and TR4 are turned off, the node POUT may float.

In FIG. 8B, since the input signal IN is in the high state, the second transistor TR2 may be turned on, and since the inverted input signal INB is in the low state, the third transistor TR3 may be turned off. Since the inverted power on reset signal PORB is in the high state, the fourth and seventh transistors TR4 and TR7 may be turned off. Therefore, as the fourth transistor TR4 is turned off and the first and second transistors TR1 and TR2 are turned on, the node POUT may be in a low state. However, as the third and seventh transistors TR3 and TR7 are turned off, the node NOUT may float.

As a result, when the signal input from the outside is in a low state, the node POUT may float, and when the signal input from the outside is in a high state, the node NOUT may float. That is, a node may float regardless of whether the signal input from the outside is in the low state or the high state. Therefore, in order to prevent the node from floating, the signal applied to the fourth and seventh transistors TR4 and TR7 is required to be controlled to different states.

This will be described in more detail with reference to FIG. 12 and the subsequent drawings.

Figures 9, 10:
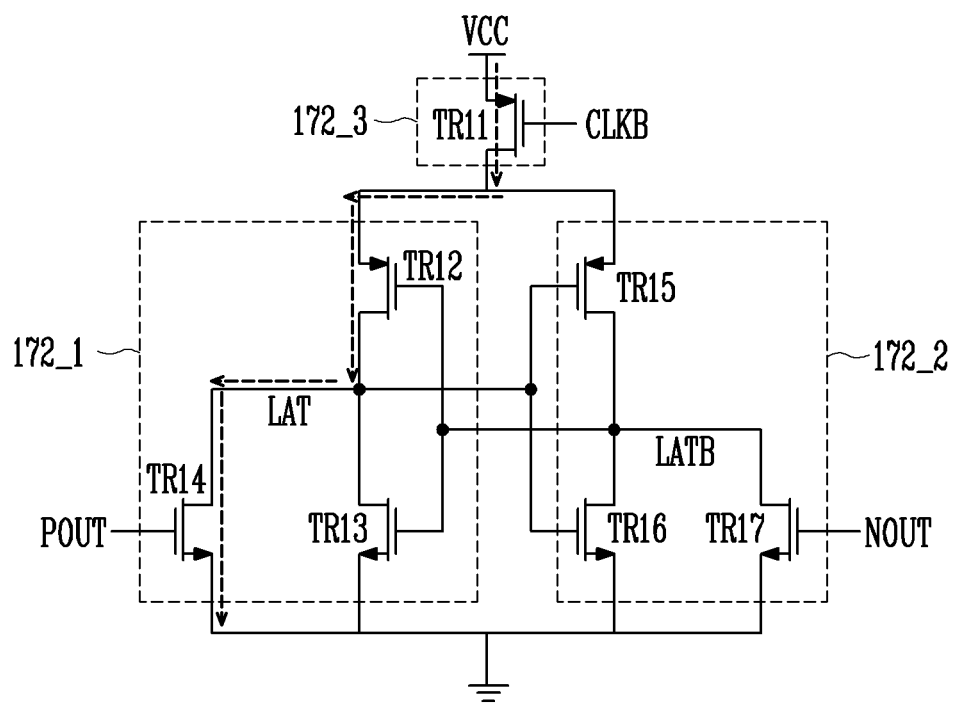
FIG. 9 is a diagram for describing a configuration of a second stage $2^{nd}$ STAGE of FIG. 6 and leakage of current.
FIG. 10 is a diagram for describing turning-on or turning-off of transistors included in FIG. 9.

FIG. 9 is a diagram for describing a configuration of the second stage $2^{nd}$ STAGE of FIG. 6.

Referring to FIGS. 6 and 9, FIG. 9 shows the second stage $2^{nd}$ STAGE of the first to third stages $1^{st}$ to $3^{rd}$ STAGEs included in the latch circuit 170A of FIG. 6. The second stage $2^{nd}$ STAGE may be a latch component that temporarily stores data. The second stage $2^{nd}$ STAGE may be configured of first and second latches 172_1 and 172_2 and a second driving circuit 172_3. The first and second latches 172_1 and 172_2 may be connected between the second driving circuit 172_3 and ground.

In an embodiment, the first latch 172_1 may be configured of twelfth, thirteenth, and fourteenth transistors TR12, TR13, and TR14, the second latch 172_2 may be configured of fifteenth, sixteenth, and seventeenth transistors TR15, TR16, and TR17, and the second driving circuit 172_3 may be configured of an eleventh transistor TR11. The thirteenth, fourteenth, sixteenth, and seventeenth transistors TR13, TR14, TR16, and TR17 may be implemented as NMOS transistors, and the eleventh, twelfth, and fifteenth transistors TR11, TR12, and TR15 may be implemented as PMOS transistors.

In an embodiment, since the first latch 172_1 includes the thirteenth transistor TR13 which is the NMOS transistor and the twelfth transistor TR12 which is the PMOS transistor, the first latch 172_1 may store data. In addition, since the second latch 172_2 includes the sixteenth transistor TR16 which is the NMOS transistor and the fifteenth transistor TR15 which is the PMOS transistor, the second latch 172_2 may store data similarly to the first latch 172_1.

In FIG. 9, it is assumed that the memory device 100 of FIG. 4 is in the idle state, similar to the embodiment shown in FIG. 7. That is, since the clock CLK input through the input/output strobe lines (DQS) is in a high state, the inverted clock CLKB is in a low state. Therefore, since the inverted clock CLKB of the low state is applied to a gate of the eleventh transistor TR11 of the second driving circuit 172_3, the eleventh transistor TR11 may be turned on.

FIG. 9 shows as an example a case where the node POUT floats and leakage of current occurs when the input signal IN of FIG. 7 is in the low state and the inverted input signal INB of FIG. 7 is in the high state.

In an embodiment, since the node POUT is a floating node, a potential of a node LAT may be a constant potential other than a ground voltage (0V). That is, when the node POUT is in a high state, the potential of the node LAT becomes the ground voltage (0V), and thus a leakage current does not flow to the fourteenth transistor TR14. However, when the node POUT is the floating node, a voltage of the node LAT is not 0V, a leakage current may flow to the fourteenth transistor TR14.

As the potential of the node LAT has a specific value, a voltage other than the ground voltage (0V) may be applied to gates of the fifteenth and sixteenth transistors TR15 and TR16 of the second latch 172_2. Therefore, the fifteenth transistor TR15 may be turned on and the sixteenth transistor TR16 may be turned off.

In an embodiment, since the input signal IN is in the low state and the inverted input signal INB is in the high state, the node NOUT may be in a low state. Therefore, a signal from the node NOUT of a low state may be applied to a gate of the seventeenth transistor TR17 of the second latch 172_2. When the signal of the low state is applied to the gate of the seventeenth transistor TR17, the seventeenth transistor TR17 may be turned off, and as the potential of the node LATB has a specific value, a signal of a floating state may be applied to gates of the twelfth and thirteenth transistors TR12 and TR13. Therefore, the twelfth transistor TR12 may be turned on and the thirteenth transistor TR13 may be turned off.

As a result, as an unstable signal is applied to a gate of the fourteenth transistor TR14, current may flow through the eleventh, twelfth, and fourteenth transistors TR11, TR12, and TR14. That is, as a node floats, a current path is formed, and current may flow through the formed current path.

In another embodiment, when the input signal IN is in the high state and the inverted input signal INB is in the low state, the node NOUT may float and leakage of current may occur (not shown).

FIG. 10 is a diagram for describing the turning-on or turning-off of the transistors included in FIG. 9.

Referring to FIGS. 9 and 10, FIG. 10 shows turning-on ON or turning-off OFF of the eleventh to seventeenth transistors TR11 to TR17 when the clock CLK is in the high state and the inverted clock CLKB is in the low state. That is, FIG. 10 shows the turning-on ON or turning-off OFF of the eleventh to seventeenth transistors TR11 to TR17 when the memory device 100 of FIG. 1 is in the idle state.

In addition, FIG. 10 shows the turning-on ON or turning-off OFF of the eleventh to seventeenth transistors TR11 to TR17 when the node POUT is floating (POUT=Floating) and the potential of the node NOUT is the ground voltage (0V). That is, FIG. 10 shows turning-on ON or turning-off OFF of the transistors of the second state $2^{nd}$ STAGE of FIG. 9 when the input signal IN is in the low state, the inverted input signal INB is in the high state, and the inverted power on reset signal PORB is in the high state. The second stage $2^{nd}$ STAGE may be a latch component that temporarily stores data.

In an embodiment, since the node POUT is the floating node (POUT=Floating), the node LAT may float in a state in which the fourteenth transistor TR14 is in a turn-off state. That is, a floating voltage may be applied to a gate of the fourteenth transistor TR14, and thus the fourteenth transistor TR14 may maintain the turn-off state.

Since the node LAT floats, a specific voltage other than the ground voltage (0V) may be applied to gates of the fifteenth and sixteenth transistors TR15 and TR16. However, the voltage applied to the gate of the fifteenth transistor TR15 may be less than a voltage that turns off the fifteenth transistor TR15, and the voltage applied to the gate of the sixteenth transistor TR16 may be less than a voltage that turns on the sixteenth transistor TR16. Therefore, the fifteenth transistor TR15 may be turned on and the sixteenth transistor TR16 may be turned off.

In an embodiment, since the potential of the node NOUT is the ground voltage 0V, not only the node LAT but also a node LATB may float in a state in which the seventeenth transistor TR17 is turned off. Since the node LATB floats, a specific voltage other than the ground voltage (0V) may be applied to gates of the twelfth and thirteenth transistors TR12 and TR13. However, the voltage applied to the gate of the twelfth transistor TR12 may be less than a voltage that turns off the twelfth transistor TR12, and the voltage applied to the gate of the twelfth transistor TR13 may be less than a voltage that turns on the thirteenth transistor TR13. Therefore, the twelfth transistor TR12 may be turned on and the thirteenth transistor TR13 may be turned off.

As a result, since the eleventh and twelfth transistors TR11 and TR12 are turned on and the fourteenth transistor TR14 is turned off, a leakage current may flow through the eleventh, twelfth, and fourteenth transistors TR11, TR12, and TR14. This is because an unexpected turning-on or turning-off of the transistor occurs as the node POUT becomes a floating node and thus the node LAT and the node LATB become floating nodes.

Figure 11:
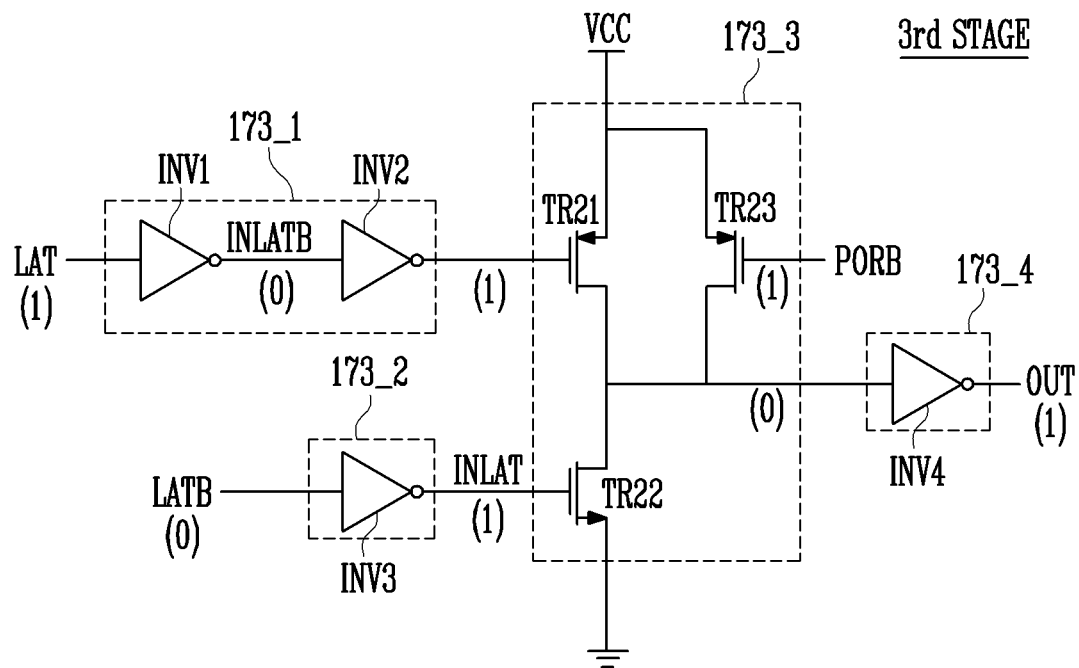
FIG. 11 is a diagram for describing a configuration of a third stage $3^{rd}$ STAGE of FIG. 6.

FIG. 11 is a diagram for describing a configuration of the third stage $3^{rd}$ STAGE of FIG. 6.

Referring to FIGS. 6 and 11, FIG. 11 shows the third stage $3^{rd}$ STAGE among the first to third stages $1^{st}$ to $3^{rd}$ STAGEs included in the latch circuit 170A of FIG. 6. The third stage $3^{rd}$ STAGE may be a driver that outputs data.

The third stage $3^{rd}$ STAGE may be configured of first and second delay circuits 173_1 and 173_2, and first and second output circuits 173_3 and 173_4. Each of the first and second delay circuits 173_1 and 173_2 may be connected to the first output circuit 173_3, and the second output circuit 173_4 may be connected to the first output circuit 173_3.

In an embodiment, the first delay circuit 173_1 may be configured of first and second inverters INV1 and INV2, and the second delay circuit 173_2 may be configured of a third inverter INV3. In addition, the first output circuit 173_3 may be configured of the twenty-first to twenty-third transistors TR21 to TR23. The twenty-first and twenty-third transistors TR21 and TR23 may be implemented as PMOS transistors, and the twenty-second transistor TR22 may be implemented as an NMOS transistor. The second output circuit 173_4 may be configured as a fourth inverter INV4.

In FIG. 11, it is assumed that the memory device 100 of FIG. 1 is in the idle state similar to the embodiment shown in FIG. 7. However, in FIG. 11, there is no floating node. That is, since the node POUT and the node NOUT of FIG. 7 are not floating nodes, the node LAT and the node LATB may not be floating nodes.

In an embodiment, the signal LAT from the node LAT may be input to the first inverter INV1. The signal LAT is in a high state (1). That is, a floating node is not present and a potential of the node LAT of FIG. 9 is in a high state.

Since the first inverter INV1 inverts an input signal and outputs an inverted signal, when the signal LAT of the high state (1) is input to the first inverter INV1, a signal INLATB of a low state (0) may be output. The signal INLATB of the low state (0) may be input to the second inverter INV2. Since the second inverter INV2 also inverts an input signal and outputs an inverted signal, when the signal INLATB of the low state (0) is input to the second inverter INV2, a signal of the high state (1) may be output. The signal of the high state (1) may be applied to a gate of the twenty-first transistor TR21. When the signal of the high state (1) is applied to the gate of the twenty-first transistor TR21, the twenty-first transistor TR21 may be turned off.

In an embodiment, since the inverted power on reset signal PORB is in the high state (1) in the idle state of the memory device 100 of FIG. 1, the inverted power on reset signal PORB of the high state (1) may be applied to the gate of the twenty-third transistor TR23. Therefore, the twenty-third transistor TR23 may be turned off.

In an embodiment, the signal LATB from the node LATB may be input to the third inverter INV3. Since the signal LAT is in the high state (1), the signal LATB may be in the low state (0).

Since the third inverter INV3 inverts an input signal and outputs an inverted signal, when the signal LATB of the low state (0) is input to the third inverter INV3, a signal INLAT of the high state (1) may be output. The signal INLAT of the high state (1) may be applied to a gate of the twenty-second transistor TR22. When the signal INLAT of the high state (1) is applied to the gate of the twenty-second transistor TR22, the twenty-second transistor TR22 may be turned on.

As a result, the twenty-first transistor TR21 is turned off, the twenty-second transistor TR22 is turned on, and the ground voltage (0V) may be input to the fourth inverter INV4. Therefore, since the fourth inverter INV4 inverts an input signal and outputs an inverted signal, when the ground voltage (0V) is input to the fourth inverter INV4, a signal of the high state (1) may be output (OUT).

However, when a node floats, that is, when the node POUT or the node NOUT of FIG. 7 floats, the node LAT or the node LATB becomes the floating node, and thus the floating signal LAT may be applied to the first inverter INV1. Therefore, when the signal LAT is applied to the first inverter INV1, a signal of the high state (1) or the low state (0) may not be output.

As a result, when the node floats, a signal of the high state or the low state is not correctly output, and thus it is necessary to prevent the node from floating.

Hereinafter, a signal generated to prevent the node from floating will be described in detail.

Figure 12:
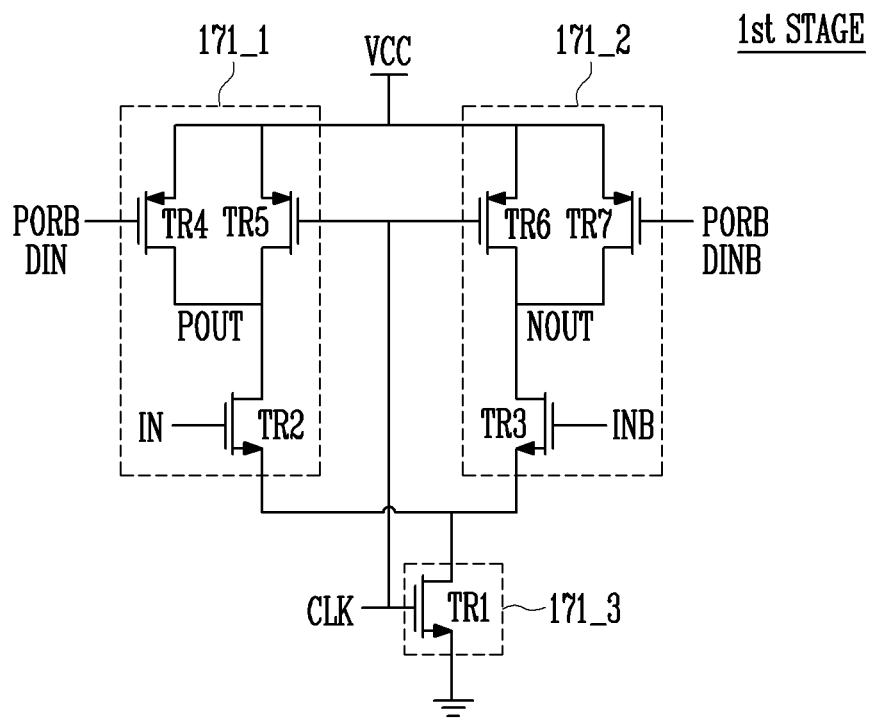
FIG. 12 is a diagram for describing application of signals generated according to data input from the first stage $1^{st}$ STAGE of FIG. 6.

FIG. 12 is a diagram for describing application of signals generated according to data input from the first stage $1^{st}$ STAGE of FIG. 6.

Referring to FIGS. 7 and 12, differently from FIG. 7, FIG. 12 shows that the first signal PORB DIN is applied to the gate of the fourth transistor TR4, and the second signal PORB DINB is applied to the gate of the seventh transistor TR7. That is, FIG. 12 shows that different signals are applied to the gates of the fourth and seventh transistors TR4 and TR7.

In FIG. 12, it is assumed that the memory device 100 of FIG. 4 is in the idle state. That is, the clock CLK input through the input/output strobe lines (DQS) is in the high state. Therefore, since a signal of a high state is applied to the gates of the fifth and sixth transistors TR5 and TR6, the fifth and sixth transistors TR5 and TR6 may be turned off.

In description with reference to FIG. 12, contents repetitive to that with reference to FIG. 7 will be omitted.

In an embodiment, the first stage $1^{st}$ STAGE may be configured of an enable controller 171_3, a current mirror component, a data input circuit, and a data output circuit. The first stage 1$^{st}$ STAGE may be a buffer that stores and outputs data.

Specifically, the enable controller 171_3 may be configured of the first transistor TR1, the current mirror component may be configured of the fifth and sixth transistors TR5 and TR6, the data input circuit may be configured of the second and third transistors TR2 and TR3, and the data output circuit may be configured of the node POUT and the node NOUT. A reset control signal may be input to the gates of the fourth and seventh transistors TR4 and TR7 of the first stage 1$^{st}$ STAGE.

In an embodiment, the enable controller 171_3 may control the first stage 1$^{st}$ STAGE to be in an enable state in which the first stage 1$^{st}$ STAGE may store data or output data, according to the input strobe signal, that is, the clock CLK. In addition, the current mirror component may control providing the same current to a node connecting the second and fifth transistors TR2 and TR5 to each other, and a node connecting the third and sixth transistors TR3 and TR6 to each other. Data received from the outside may be input to the data input circuit. The data output circuit, that is, the node POUT and the node NOUT, may output new data based on a changed current generated by changing a current provided by the current mirror component by the signal input to the gates of the fourth and seventh transistors TR4 and TR7.

In an embodiment, the first stage 1$^{st}$ STAGE may be configured of a data storage and a data reset component. Specifically, the data storage may be configured of the first, second, third, fifth, and sixth transistors TR1, TR2, TR3, TR5, and TR6, and the data reset component may be configured of the fourth and seventh transistors TR4 and TR7. The reset control signal may be input to the gates of the fourth and seventh transistors TR4 and TR7.

In an embodiment, the data storage may store or output data received from the outside by the first stage 1$^{st}$ STAGE, in response to the input strobe signal, that is, the clock CLK. In addition, the data reset component may reset the data output from the data storage to a predetermined level.

In an embodiment, signals of different states may be applied to the gates of the fourth and seventh transistors TR4 and TR7. That is, when a signal of a high state is applied to the gate of the fourth transistor TR4, a signal of a low state may be applied to the gate of the seventh transistor TR7, and when a signal of a low state is applied to the gate of the fourth transistor TR4, a signal of a high state may be applied to the gate of the seventh transistor TR7.

As shown in FIG. 7, the inverted power on reset signal PORB of the same state is applied to the gates of the fourth and seventh transistors TR4 and TR7. That is, in the idle state of the memory device 100 of FIG. 4, the inverted power on reset signal PORB is in a high state, and the inverted power on reset signal PORB of the high state is identically applied to the fourth and seventh transistors TR4 and TR7. However, since the node floats as the same signal is applied to the gates of the fourth and seventh transistors TR4 and TR7, the signals of different states are required to be applied to the gates of the fourth and seventh transistors TR4 and TR7.

In the present disclosure, as the first signal PORB DIN is applied to the gate of the fourth transistor TR4 and the second signal PORB DINB is applied to the gate of the seventh transistor TR7, the signals of different states may be applied to the fourth and seventh transistors TR4 and TR7.

In an embodiment, the first signal PORB DIN and the second signal PORB DINB having different states from each other may be in a high state (1) or a low state (0) according to the input data. That is, a signal that prevents a node from floating may be generated based on the input data.

For example, as described with reference to FIG. 7, when the input signal IN is in a low state (0), the second and fourth transistors TR2 and TR4 may be turned off and the node POUT becomes a floating node, and thus a signal for turning on the fourth transistor TR4 may be generated.

The signal generated based on the input data will be described in more detail with reference to FIGS. 13A, 13B, and 14.

Figure 13A:
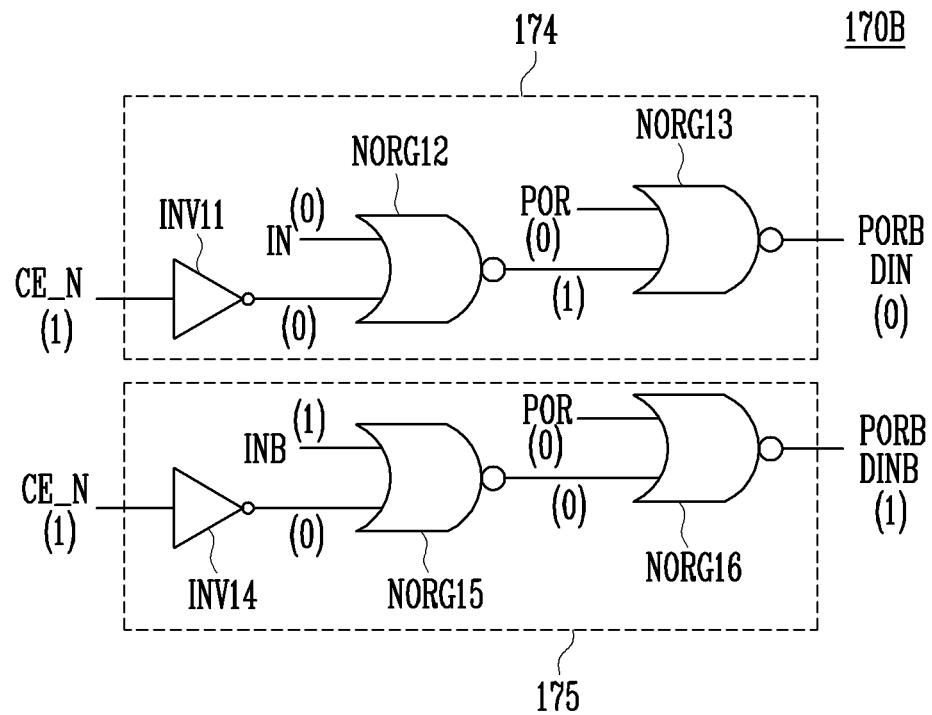
FIGS. 13A and 13B are diagrams for describing an embodiment of signals generated in a reset control circuit of FIG. 6.
Figure 13B:
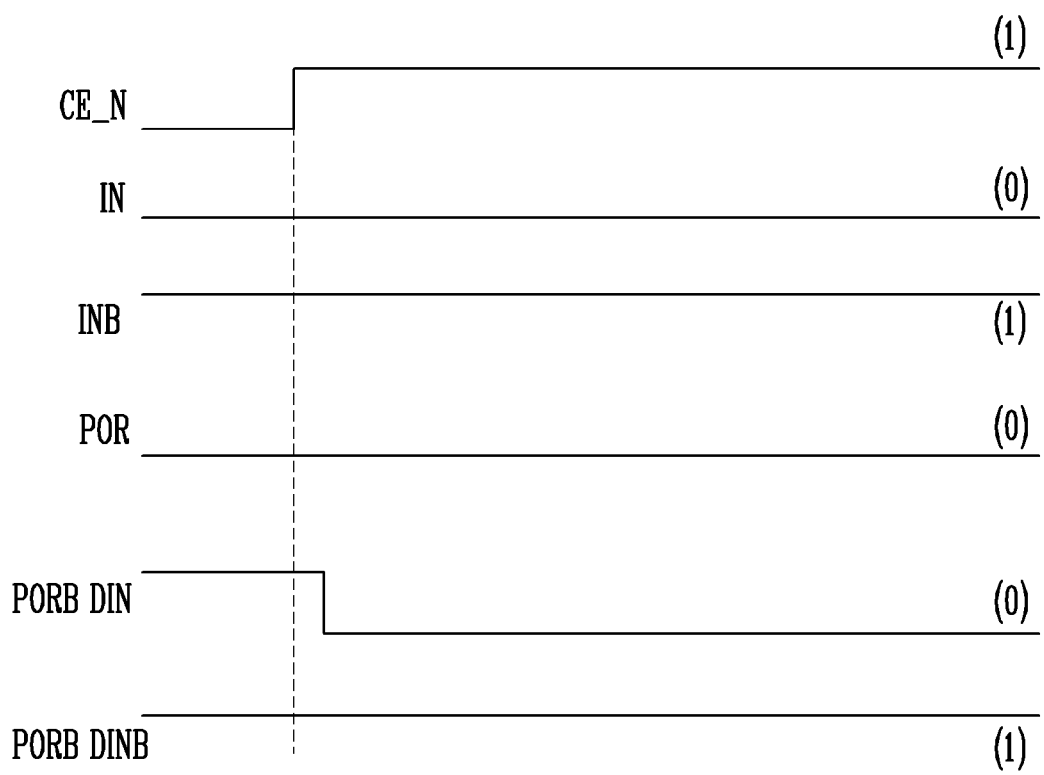

FIGS. 13A and 13B are diagrams for describing an embodiment of signals generated in the reset control circuit of FIG. 6.

Referring to FIGS. 13A and 13B, FIG. 13A shows an embodiment of a signal generated according to input data, and FIG. 13B shows a timing diagram for the signal generated in FIG. 13A. Specifically, FIG. 13A shows a reset control circuit that generates signals applied to the gates of the fourth and seventh transistors TR4 and TR7 of FIG. 12, and FIG. 13B shows a process of generating the signals applied to the gates of the fourth and seventh transistors TR4 and TR7.

In FIGS. 13A and 13B, the memory device 100 of FIG. 4 is in the idle state. In FIGS. 13A and 13B, the input signal IN is in the low state and the inverted input signal INB is in the high state.

As described with reference to FIG. 7, when the input signal IN is in the low state and the inverted input signal INB is in the high state, the node POUT becomes a floating node and a leakage current occurs. However, in the present disclosure, the first signal PORB DIN and the second signal PORB DINB of different states may be generated so that the node POUT does not become the floating node.

Referring to FIG. 13A, the reset control circuit may be configured of first and second control circuits 174 and 175, and the first control circuit 174 may include an eleventh inverter INV11, and twelfth and thirteenth NOR gates NORG12 and NORG13. In addition, the second control circuit 175 may include a fourteenth inverter INV14, and fifteenth and sixteenth NOR gates NORG15 and NORG16.

An inverted chip enable signals CE_N may be input to the eleventh and fourteenth inverters INV11 and INV14. Since the chip enable signal CE is a signal for selecting a chip, when the memory device 100 of FIG. 4 is operating, the chip enable signal CE may be in a low state (0) and the inverted chip enable signal CE_N may be in a high state (1). Therefore, the inverted chip enable signal CE_N of the high state (1) may be input to the eleventh and fourteenth inverters INV11 and INV14.

In an embodiment, when an initialization signal of a low state (0), that is, the inverted chip enable signal CE_N of the low state (0) is input, the data output circuit (the node POUT and the node NOUT) may be reset according to the power on reset signal POR regardless of the data IN and INB input to the data input circuit TR2 and TR3 of FIG. 12. Alternatively, when the inverted chip enable signal CE_N of the low state (0) is input, the output of the data output from the data storage TR1, TR2, TR3, TR5, and TR6 may be reset according to the power on reset signal POR regardless of the data received by the data storage TR1, TR2, TR3, TR5, and TR6 of FIG. 12.

That is, when the inverted chip enable signal CE_N of the low state (0) is input to the eleventh and fourteenth inverters INV11 and INV14, a signal of a high state (1) may be output from the eleventh and fourteenth inverters INV11 and INV14. When the signal of the high state (1) is input to the twelfth and fifteenth NOR gates NORG12 and NORG15, a signal of a low state (0) may be output from the twelfth and fifteenth NOR gates NORG12 and NORG15 regardless of the input signal IN and the inverted input signal INB.

Therefore, since the signal of the low state (0) output from the twelfth and fifteenth NOR gates NORG12 and NORG15 are input to the thirteenth and sixteenth NOR gates NORG13 and NORG16, the first signal PORB DIN and the second signal PORB DINB may be determined according to the power on reset signal POR.

In an embodiment, when the initialization signal of a high state (1), that is, the inverted chip enable signal CE_N of the high state (1) is input, the data output circuit may be reset according to the data IN and INB input to the data input circuit TR2 and TR3, and the power on reset signal POR. Alternatively, when the inverted chip enable signal CE_N of the high state (1) is input, the output of the data output from the data storage may be reset according to the data received by the data storage TR1, TR2, TR3, TR5, and TR6 of FIG. 12 and the power on reset signal POR.

That is, when the inverted chip enable signal CE_N of the high state (1) is input to the eleventh and fourteenth inverters INV11 and INV14, a signal of a low state (0) may be output from the eleventh and fourteenth inverters INV11 and INV14. When the signal of the low state (0) is input to the twelfth and fifteenth NOR gates NORG12 and NORG15, a signal of a low state (0) or a high state (1) may be output from the twelfth and fifteenth NOR gates NORG12 and NORG15 according to whether the input signal IN and the inverted input signal INB are in the high state or the low state.

Specifically, when a data signal of a low state (0) is input to the twelfth NOR gate NORG12 or the fifteenth NOR gate NORG15, since a signal of a high state (1) is output from the twelfth NOR gate NORG12 or the fifteenth NOR gate NORG15, the output of the data output from the data output circuit or the data storage may be reset regardless of the power on reset signal POR.

Conversely, when a data signal of a high state (1) is input to the twelfth NOR gate NORG12 or the fifteenth NOR gate NORG15, since a signal of a low state (0) is output from the twelfth NOR gate NORG12 or the fifteenth NOR gate NORG15, the output of the data output from the data output circuit or the data storage may be reset according to the power on reset signal POR.

For example, when the inverted chip enable signal CE_N of the high state (1) is input to the eleventh and fourteenth inverters INV11 and INV14, a signal of the low state (0) may be output from the eleventh and fourteenth inverters INV11 and INV14. The signal of the low state (0) output from the eleventh and fourteenth inverters INV11 and INV14 may be input to the twelfth and fifteenth NOR gates NORG12 and NORG15, respectively.

In an embodiment, since the input signal IN is in the low state (0) and the inverted input signal INB is in the high state (1), the input signal IN of the low state (0) may be input to the twelfth NOR gate NORG12 and the inverted input signal INB of the high state (1) may be input to the fifteenth NOR gate NORG15.

Since the two signals of the low state are input to the twelfth NOR gate NORG12, a signal of a high state (1) may be output from the twelfth NOR gate NORG12. In addition, since the signal of the high state (1) and the signal of the low state (0) are input to the fifteenth NOR gate NORG15, a signal of a low state (0) may be output from the fifteenth NOR gate NORG15.

In an embodiment, when the memory device 100 of FIG. 4 is in the idle state, the inverted power on reset signal PORB is in the high state (1), and thus the power on reset signal POR may be in the low state (0). Therefore, the power on reset signal POR of the low state (0) and the signal of the high state (1) output from the twelfth NOR gate NORG12 may be input to the thirteenth NOR gate NORG13. In addition, the power on reset signal POR of the low state (0) and the signal of the low state (0) output from the fifteenth NOR gate NORG15 may be input to the sixteenth NOR gate NORG16.

The signals of the low state (0) and the high state (1) may be input to the thirteenth NOR gate NORG13, and thus the first signal PORB DIN of the low state (0) may be output. The two signals of the low state (0) may be input to the sixteenth the NOR gate NORG16, and thus the second signal PORB DINB of the high state (1) may be output. Therefore, the first signal PORB DIN and the second signal PORB DINB of different states may be generated. The first signal PORB DIN and the second signal PORB DINB of different states may be applied to the gates of the fourth and seventh transistors TR4 and TR7 of FIG. 12, respectively.

Referring to FIG. 12, since the first signal PORB DIN of the low state (0) is applied to the gate of the fourth transistor TR4 of FIG. 12, the fourth transistor TR4 may be turned on. Therefore, the second transistor TR2 of FIG. 12 is turned off, however, as the fourth transistor TR4 is turned on, the node POUT may be in a high state (1). That is, the node POUT may not float and may maintain the high state (1).

In addition, since the second signal PORB DINB of the high state (1) is applied to the gate of the seventh transistor TR7 of FIG. 12, the seventh transistor TR7 may be turned off. Therefore, the third transistor TR3 of FIG. 12 is turned on, however, as the seventh transistor TR7 is turned off, the node NOUT may be in a low state (0). That is, the node NOUT may maintain the low state (0).

As a result, when the input signal IN is in the low state (0) and the inverted input signal INB is in the high state (1), the first signal PORB DIN of the low state (0) and the second signal PORB DINB of the high state (1) may be generated, and thus the node POUT may not float and may maintain the high state (1).

Referring to FIG. 13B, the input signal IN may be in the low state (0), the inverted input signal INB may be in the high state (1), and the power on reset signal POR may be in the low state (0).

In an embodiment, before the memory device 100 of FIG. 4 is selected, that is, when the chip enable signal CE is in the high state (1), the inverted chip enable signal CE_N may be in the low state (0), and all signals output through the eleventh and fourteenth inverters INV11 and INV14 may be in the high state (1). Therefore, all signals output through the twelfth and fifteenth NOR gates NORG12 and NORG15 may in the low state (0), and both of the first signal PORB DIN and the second signal PORB DINB may be output as the high state (1).

Thereafter, when the memory device 100 of FIG. 4 for inputting data is selected, the chip enable signal CE may be changed from the high state (1) to the low state (0), and the inverted chip enable signal CE_N may be changed from the low state (0) to the high state (1). Therefore, since the inverted chip enable signal CE_N of the high state (1) is input to the eleventh and fourteenth inverters INV11 and INV14, all signals output through the eleventh and fourteenth inverters INV11 and INV14 may be in the low state (0).

Since the signals of the low state (0) are output through the eleventh and fourteenth inverters INV11 and INV14, different signals may be output through the twelfth and fifteenth NOR gates NORG12 and NORG15 according to the input data. As a result, the first signal PORB DIN of the low state (0) and the second signal PORB DINB of the high state (1) may be generated, and thus the node POUT may not float and may maintain the high state (1).

The first signal PORB DIN and the second signal PORB DINB generated when the input signal IN is in the high state (1) and the inverted input signal INB is in the low state (0) will be described with reference to FIGS. 14A and 14B.

Figure 14A:
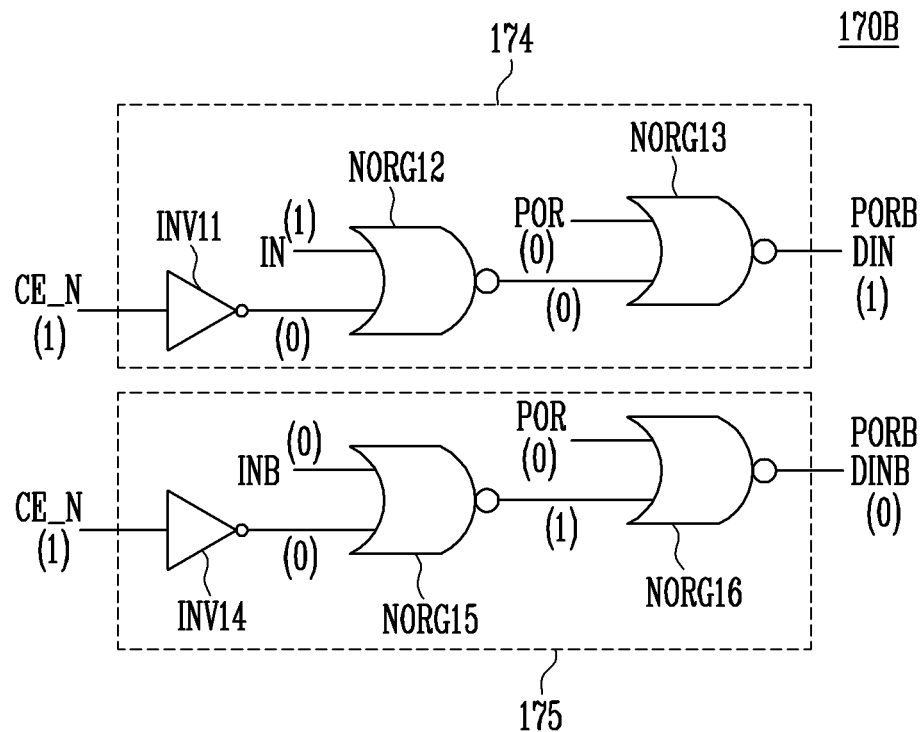
FIGS. 14A and 14B are diagrams for describing another embodiment of the signals generated in the reset control circuit of FIG. 6.
Figure 14B:
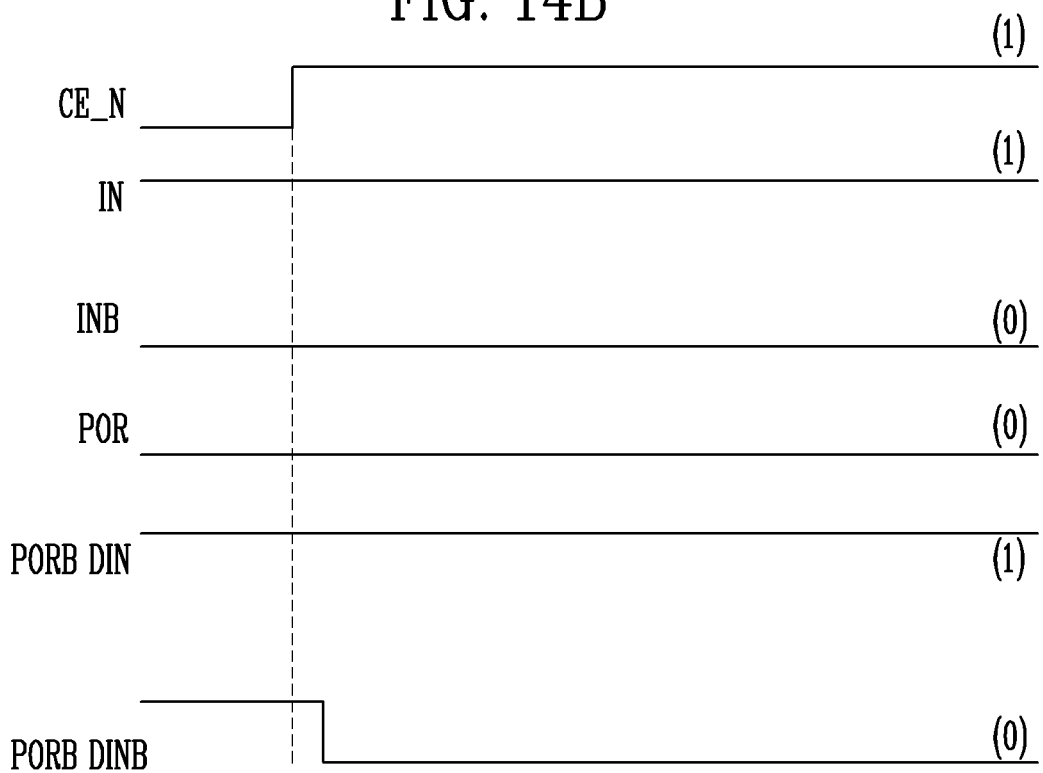

FIGS. 14A and 14B are diagrams for describing another embodiment of the signals generated in the reset control circuit of FIG. 6.

Referring to FIGS. 14A and 14B, FIGS. 14A and 14B are diagrams for describing another embodiment of a signal generated according to input data. FIG. 14A shows an embodiment of a signal generated according to input data, and FIG. 14B shows a timing diagram for the signal generated in FIG. 14A. Specifically, FIG. 14A shows a reset control circuit that generates the signals applied to the gates of the fourth and seventh transistors TR4 and TR7 of FIG. 12, and FIG. 14B shows a process of generating the signals applied to the gates of the fourth and seventh transistors TR4 and TR7.

In FIGS. 14A and 14B, the memory device 100 of FIG. 4 is in the idle state.

Differently from FIGS. 13A and 13B, in FIGS. 14A and 14B, the input signal IN is in the high state (1) and the inverted input signal INB is in the low state (0). That is, FIGS. 14A and 14B show a process of generating the first signal PORB DIN and the second signal PORB DINB to prevent the node NOUT of FIG. 7 from floating when the input signal IN is in the high state (1) and the inverted input signal INB is in the low state (0).

Referring to FIG. 14A, when the inverted chip enable signal CE_N of the high state (1) is input to the eleventh and fourteenth inverters INV11 and INV14, the signal of the low state (0) may be output from the eleventh and fourteenth inverters INV11 and INV14. The signal of the low state (0) output from the eleventh and fourteenth inverters INV11 and INV14 may be input to the twelfth and fifteenth NOR gates NORG12 and NORG15, respectively.

In an embodiment, since the input signal IN is in the high state (1) and the inverted input signal INB is in the low state (0), the input signal IN of the high state (1) may be input to the twelfth NOR gate NORG12 and the inverted input signal INB of the low state (1) may be input to the fifteenth NOR gate NORG15.

Since the signal of the high state (1) and the signal of the low state (0) are input to the twelfth NOR gate NORG12, a signal of a low state (1) may be output from the twelfth NOR gate NORG12. In addition, since the two signals of the low state (0) are input to the fifteenth north gate NORG15, a signal of a high state (1) may be output from the fifteenth north gate NORG15.

In an embodiment, when the memory device 100 of FIG. 4 is in the idle state, the inverted power on reset signal PORB is in the high state (1), and thus the power on reset signal POR may be in the low state (0). Therefore, the power on reset signal POR of the low state (0) and the signal of the low state (0) output from the twelfth NOR gate NORG12 may be input to the thirteenth NOR gate NORG13. In addition, the power on reset signal POR of the low state (0) and the signal of the high state (1) output from the fifteenth NOR gate NORG15 may be input to the sixteenth NOR gate NORG16.

The two signals of the low state (0) may be input to the thirteenth NOR gate NORG13, and thus the first signal PORB DIN of the high state (1) may be output. The signal of the low state (0) and the signal of the high state (1) may be input to the sixteenth NOR gate NORG16, and thus the second signal PORB DINB of the low state (0) may be output. Therefore, the first signal PORB DIN and the second signal PORB DINB of different states may be generated. The first signal PORB DIN and the second signal PORB DINB of different states may be applied to the gates of the fourth and seventh transistors TR4 and TR7 of FIG. 12, respectively.

Referring to FIG. 12, since the second signal PORB DINB of the low state (0) is applied to the gate of the seventh transistor TR7 of FIG. 12, the seventh transistor TR7 may be turned on. Therefore, the third transistor TR3 of FIG. 12 is turned off, however, as the seventh transistor TR7 is turned on, the node NOUT may be in a high state (1). That is, the node NOUT may not float and may maintain the high state (1).

In addition, since the first signal PORB DIN of the high state (1) is applied to the gate of the fourth transistor TR4 of FIG. 12, the fourth transistor TR4 may be turned off. Therefore, the second transistor TR2 of FIG. 12 is turned on, however, as the fourth transistor TR4 is turned off, the node POUT may be in a low state (0). That is, the node POUT may maintain the low state (0).

As a result, when the input signal IN is in the high state (1) and the inverted input signal INB is in the low state (0), the first signal PORB DIN of the high state (1) and the second signal PORB DINB of the low state (0) may be generated, and thus the node NOUT may not float and may maintain the high state (1).

Referring to FIG. 14B, the input signal IN may be in the low state (0), the inverted input signal INB may be in the high state (1), and the power on reset signal POR may be in the low state (0).

In an embodiment, before the memory device 100 of FIG. 4 is selected, that is, when the chip enable signal CE is in the high state (1), the inverted chip enable signal CE_N may be in the low state (0), and all signals output through the eleventh and fourteenth inverters INV11 and INV14 may be in the high state (1). Therefore, all signals output through the twelfth and fifteenth NOR gates NORG12 and NORG15 may in the low state (0), and both of the first signal PORB DIN and the second signal PORB DINB may be output as the high state (1).

Thereafter, when the memory device 100 of FIG. 4 for inputting data is selected, the chip enable signal CE may be changed from the high state (1) to the low state (0), and the inverted chip enable signal CE_N may be changed from the low state (0) to the high state (1). Therefore, since the inverted chip enable signal CE_N of the high state (1) is input to the eleventh and fourteenth inverters INV11 and INV14, all signals output through the eleventh and fourteenth inverters INV11 and INV14 may be in the low state (0).

Since the signals of the low state (0) are output through the eleventh and fourteenth inverters INV11 and INV14, different signals may be output through the twelfth and fifteenth NOR gates NORG12 and NORG15 according to the input data. As a result, the first signal PORB DIN of the low state (0) and the second signal PORB DINB of the high state (1) may be generated, and thus the node POUT may not float and may maintain the high state (1).

Figure 15:
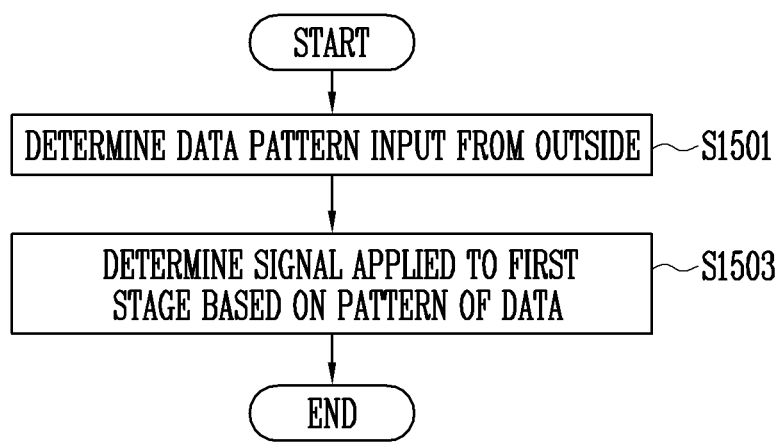
FIG. 15 is a diagram for describing an operation of the memory device according to an embodiment of the present disclosure.

FIG. 15 is a diagram for describing an operation of the memory device according to an embodiment of the present disclosure.

Referring to FIG. 15, in step S1501, the memory device may determine a pattern of data input from the outside. The pattern of the data input from the outside may be a pattern of the input signal IN applied to the gate of the second transistor TR2 of FIG. 7 and the inverted input signal INB input to the gate of the third transistor TR3. That is, the pattern of the input data may be a pattern indicating whether the input signal IN or the inverted input signal INB is in the low state or the high state.

In step S1503, the memory device may determine a signal applied to the first stage $1^{st}$ STAGE based on the pattern of the input data. Specifically, the memory device may determine signals applied to the fourth and seventh transistors TR4 and TR7 among the plurality of transistors included in the first stage $1^{st}$ STAGE.

In an embodiment, signals of different states may be generated through the reset control circuit included in the data transmission circuit. That is, the signal of the high state and the signal of the low state may be generated based on the pattern of the input data.

For example, when the input signal is in the low state, it may be determined to apply the signal of the high state to the gate of the fourth transistor TR4 and the signal of the low state to the gate of the seventh transistor TR7. Conversely, when the input signal is in the high state, it may be determined to apply the signal of the low state to the gate of the fourth transistor TR4 and the signal of the high state to the gate of the seventh transistor TR7.

Figure 16:
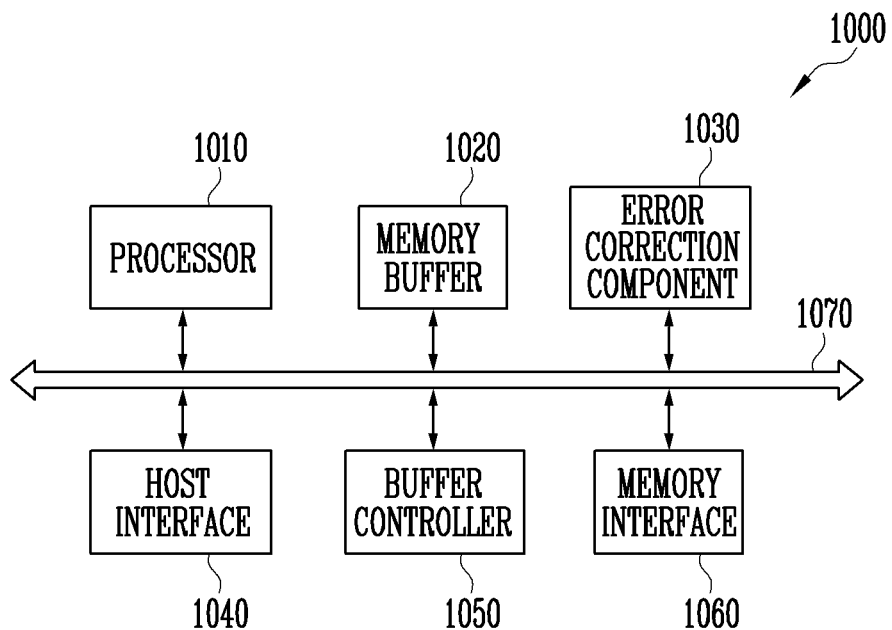
FIG. 16 is a diagram for describing another embodiment of the memory controller of FIG. 1.

FIG. 16 is a diagram for describing another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 16, the memory controller 1000 may include a processor 1010, a memory buffer 1020, an error correction component (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction component 1030 may perform error correction. The error correction component 1030 may perform error correction encoding (ECC encoding) based on data to be written to the memory device through memory interface 1060. The error correction encoded data may be transferred to the memory device through the memory interface 1060. The error correction component 1030 may perform error correction decoding (ECC decoding) on the data received from the memory device through the memory interface 1060. For example, the error correction component 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the error correction component 1030, and the memory interface 1060. The control bus may be connected to the host interface 1040, the processor 1010, the buffer controller 1050, the memory buffer 1202, and the memory interface 1060.

Figure 17:
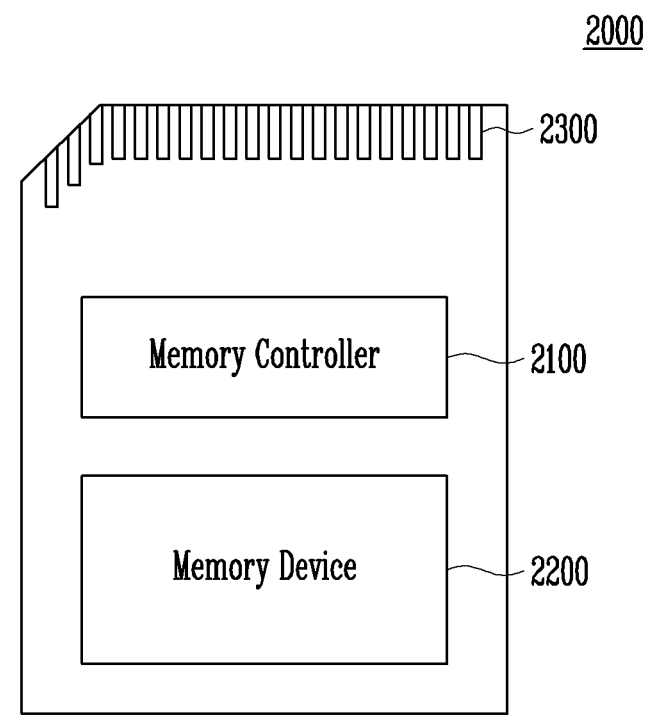
FIG. 17 is a block diagram illustrating a memory card system to which the storage device according to an embodiment of the present disclosure is applied.

FIG. 17 is a block diagram illustrating a memory card system to which the storage device according to an embodiment of the present disclosure is applied.

Referring to FIG. 17, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented with the memory device 100 of FIG. 2.

As an example, the memory controller 2100 may include components such as a random access memory (RAM), a processor, a host interface, a memory interface, and an error correction component.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory device 2200 may determine the signal to be applied to the transistors included in the data transmission circuit 170 of FIG. 5 based on data input from the memory controller 2100.

Specifically, the memory device 2200 may generate signals of different states according to whether the input data is '1' or '0'. When the signals of different states are applied to the transistors included in the data transmission circuit 170 of FIG. 5, a node may be prevented from floating in the data transmission circuit 170 of FIG. 5.

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 18:
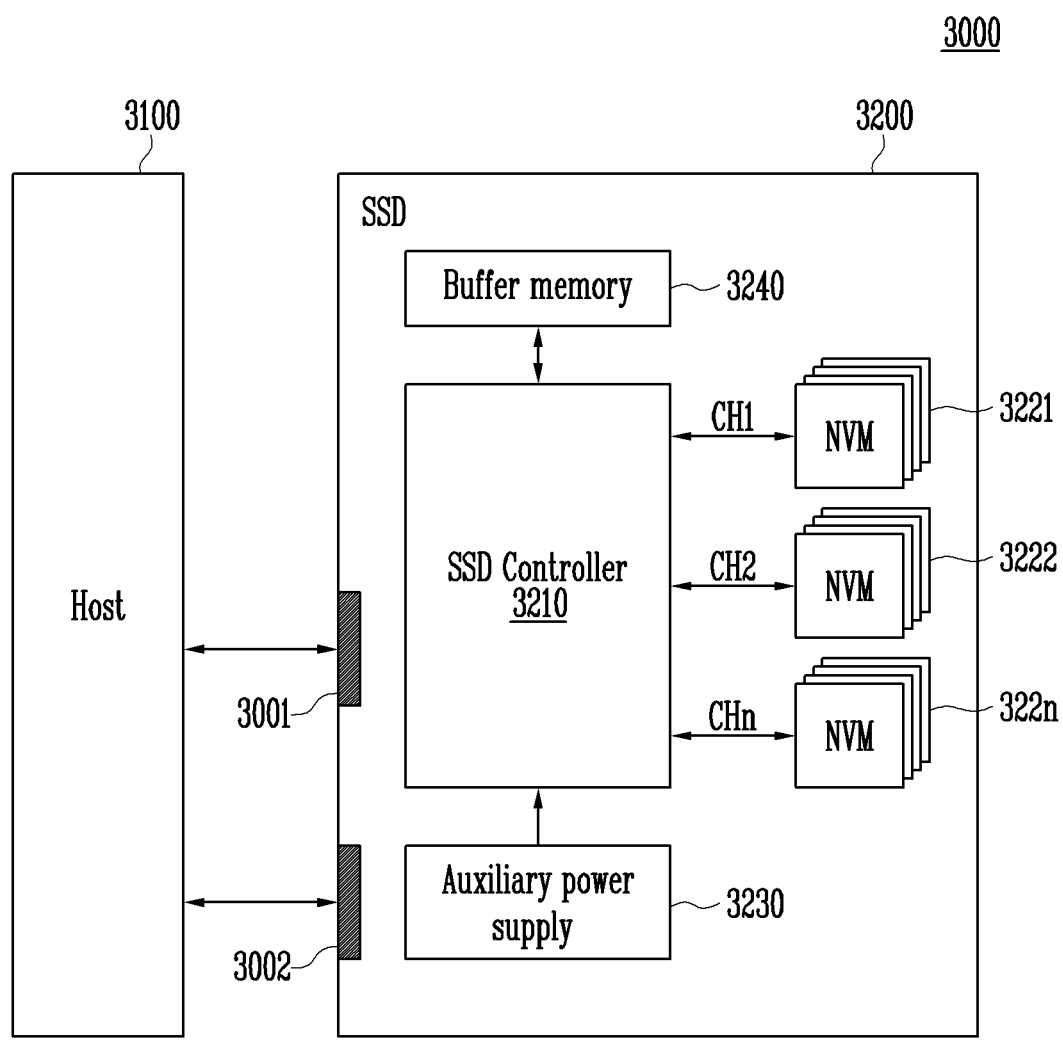
FIG. 18 is a block diagram exemplary illustrating a solid state drive (SSD) system to which the storage device according to an embodiment of the present disclosure is applied.

FIG. 18 is a block diagram exemplary illustrating a solid state drive (SSD) system to which the storage device according to an embodiment of the present disclosure is applied.

Referring to FIG. 18, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG. 1.

The SSD controller 3210 may control the plurality of flash memories 3221 to 322n in response to the signal SIG received from the host 3100. As an example, the signal SIG may be a signal based on an interface between the host 3100 and the SSD 3200. For example, the signal SIG may be a signal defined by at least one of interfaces such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

In an embodiment, the plurality of flash memories 3221 to 322n may determine a signal to be applied to transistors included in a data transmission circuit included in the plurality of flash memories 3221 to 322n based on data input from the SSD controller 3210.

Specifically, each of the plurality of flash memories 3221 to 322n may generate signals of different states according to whether the input data is '1' or '0'. When the signals of different states are applied to the transistors included in the data transmission circuit, a node may be prevented from floating in the data transmission circuit.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 19:
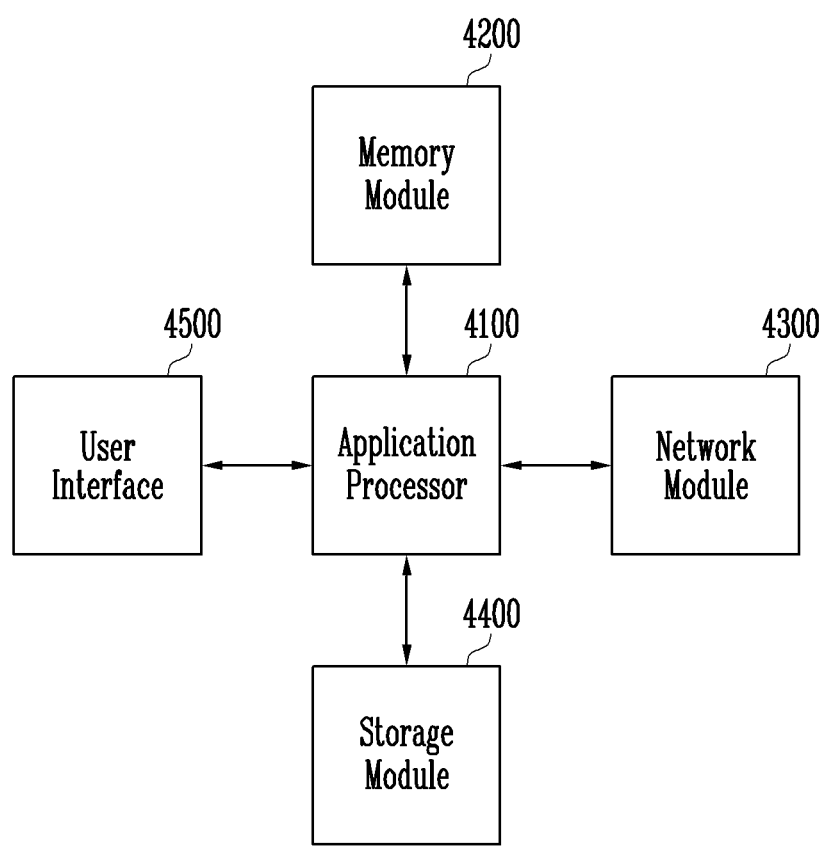
FIG. 19 is a block diagram illustrating a user system to which the storage device according to an embodiment of the present disclosure is applied.

FIG. 19 is a block diagram illustrating a user system to which the storage device according to an embodiment of the present disclosure is applied.

Referring to FIG. 19, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

In an embodiment, the storage module 4400 may determine a signal to be applied to transistors included in the storage module 4400 based on data input from the application processor 4100.

Specifically, the storage module 4400 may generate signals of different states according to whether the input data is '1' or '0'. When the signals of different states are applied to the transistors included in the storage module 4400, a node may be prevented from floating in the storage module 4400.

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device described with reference to FIGS. 2 and 3. The storage module may operate identically to the storage module 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A data transmission circuit that receives data from an outside and transmits the received data, the data transmission circuit comprising:
a storage configured of a plurality of stages that stores the data; and
a reset control circuit configured to generate a signal for resetting the storage based on the data,
wherein the reset control circuit comprises:
a first control circuit configured to generate a first signal based on the data; and
a second control circuit configured to generate a second signal having an opposite phase to the first signal, and
wherein the reset control circuit applies the first signal and the second signal to each of input circuits of a buffer circuit included in one of the plurality of stages.

2. The data transmission circuit of claim 1, wherein the input circuits include a plurality of transistors, and
wherein the reset control circuit applies the first signal to a gate of one of the plurality of transistors and the second signal to a gate of another one of the plurality of transistors.

3. The data transmission circuit of claim 1,
wherein the first control circuit comprises:
a first inverter to which an inverted chip enable signal is input;
a first NOR gate to which a signal output from the first inverter and an input signal are input; and
a second NOR gate to which a signal output from the first NOR gate and a power on reset signal are input, and
wherein the first signal is output from the second NOR gate.

4. The data transmission circuit of claim 1, wherein the plurality of stages comprises:
a buffer configured to generate a node voltage according to the data and a power reset signal;
a latch component configured to latch the data according to the node voltage generated by the buffer; and
a driver configured to output the data based on the latched data.

5. The data transmission circuit of claim 3, wherein a signal output from the second NOR gate is applied to a gate of a transistor connecting a node of a power source and a transistor to which the input signal is applied, among transistors included in the plurality of stages.

6. The data transmission circuit of claim 3,
wherein the second control circuit comprises:
a second inverter to which an inverted chip enable signal is input;
a third NOR gate to which a signal output from the second inverter and an inverted input signal are input; and
a fourth NOR gate to which a signal output from the third NOR gate and a power on reset signal are input, and
wherein the second signal is output from the fourth NOR gate.

7. The data transmission circuit of claim 6, wherein a signal output from the fourth NOR gate is applied to a gate of a transistor connecting a node of a power source and a transistor to which the inverted input signal is applied, among transistors included in the plurality of stages.

8. The data transmission circuit of claim 6, wherein when the input signal is in a low state, the first control circuit generates the first signal of a low state and the second control circuit generates the second signal of a high state.

9. The data transmission circuit of claim 6, wherein when the input signal is in a high state, the first control circuit generates the first signal of a high state and the second control circuit generates the second signal of a low state.

10. A method of operating a data transmission circuit including a reset control circuit and a storage configured of a plurality of stages, the method comprising:
receiving data from an outside;
generating a first signal based on the data and a second signal having an opposite phase to the first signal;
applying the first signal and the second signal to each of input circuits of a buffer circuit included in one of the plurality of stages; and
resetting the storage based on the first signal and the second signal.

11. The method of claim 10, wherein the resetting comprises applying the first signal to a gate of a transistor included in the one of the plurality of stages and the second signal to a gate of another transistor included in the one of the plurality of stages.

12. The method of claim 10,
further comprising:
inputting an inverted chip enable signal to a first inverter included in the reset control circuit;
inputting a signal output from the first inverter and an input signal to a first NOR gate included in the reset control circuit; and
inputting a signal output from the first NOR gate and a power on reset signal to a second NOR gate included in the reset control circuit,
wherein the first signal is a signal output from the second NOR gate.

13. The method of claim 12, wherein the signal output from the second NOR gate is applied to a gate of a transistor connecting a node of a power source and a transistor to which the input signal is applied, among transistors included in the plurality of stages.

14. The method of claim 12,
further comprising:
inputting an inverted chip enable signal to a second inverter included in the reset control circuit;
inputting a signal output from the second inverter and an inverted input signal to a third NOR gate included in the reset control circuit; and
inputting a signal output from the third NOR gate and a power on reset signal to a fourth NOR gate included in the reset control circuit, and
wherein the second signal is a signal output from the fourth NOR gate.

15. The method of claim 14, wherein the signal output from the fourth NOR gate is applied to a gate of a transistor connecting a node of a power source and a transistor to which the inverted input signal is applied, among transistors included in the plurality of stages.

16. The method of claim 14,
wherein the generating comprises generating, when the input signal is in a low state, the first signal of a low state and the second signal of a high state, and
wherein the generating comprises generating, when the input signal is in a high state, the first signal of a high state and the second signal of a low state.

17. A data storage circuit comprising:
an enable controller configured to control enabling the data storage circuit according to a strobe signal;
a current mirror component configured to provide the same current to different nodes according to the strobe signal;
a data input circuit configured to receive data provided from an outside;
a data output circuit configured to output data in response to the received data based on a current changed by the current mirror component;
a power reset signal generator configured to generate a power reset signal; and
a reset controller configured to reset the data output circuit in response to the received data and the power reset signal.

* * * * *